(12) United States Patent  (10) Patent No.: US 7,400,050 B2
Jovanovic et al.  (45) Date of Patent: Jul. 15, 2008

(54) QUANTUM WELL THERMOELECTRIC POWER SOURCE

(75) Inventors: Velimir Jovanovic, San Diego, CA (US); John C. Bass, La Jolla, CA (US); Saeid Ghamaty, La Jolla, CA (US)

(73) Assignee: Hi-Z Technology, Inc., San Diego, CA (US)

( * ) Notice: Subject to any disclaimer, the term of this patent is extended or adjusted under 35 U.S.C. 154(b) by 0 days.

(21) Appl. No.: 11/293,783

(22) Filed: Dec. 2, 2005

(65) Prior Publication Data

US 2006/0208492 A1  Sep. 21, 2006

Related U.S. Application Data

(63) Continuation-in-part of application No. 10/734,336, filed on Dec. 12, 2003, now Pat. No. 6,914,343, and a continuation-in-part of application No. 10/021,097, filed on Dec. 12, 2001, now Pat. No. 6,828,579.

(60) Provisional application No. 60/632,639, filed on Dec. 2, 2004.

(51) Int. Cl.
*F02B 63/04* (2006.01)

(52) U.S. Cl. .................. 290/1 R; 290/43; 310/306; 136/205; 361/690; 361/709; 361/719

(58) Field of Classification Search ................ 290/43, 290/1 R; 310/306; 136/205; 361/690, 697, 361/709, 719
See application file for complete search history.

(56) References Cited

U.S. PATENT DOCUMENTS

| | | | | |
|---|---|---|---|---|
| 5,156,004 A | * | 10/1992 | Wu et al. | 62/3.1 |
| 6,747,572 B2 | * | 6/2004 | Bocko et al. | 340/870.16 |
| 6,791,183 B2 | * | 9/2004 | Kanelis | 257/718 |
| 6,914,343 B2 | * | 7/2005 | Hiller et al. | 290/43 |

* cited by examiner

*Primary Examiner*—Darren Schuberg
*Assistant Examiner*—Iraj A Mohandesi
(74) *Attorney, Agent, or Firm*—John R. Ross; John R. Ross, III

(57) ABSTRACT

A quantum well thermoelectric module providing very high conversion of heat energy in to electrical energy. In prefered embodiments the module provides electric power for monitoring, measuring or detecting any of a variety of things (such as temperature, smoke, other pollution, flow, fluid level and vibration) and a transmitter for transmitting information measured or detected. In a preferred embodiment wireless monitor systems are utilized to monitor conditions at various locations aboard a ship and to wirelessly transmit information about those conditions to a central location. Preferably, a finned unit is provided to efficiently transfer heat from a module surface to the environment. A preferred quantum well choice is p type $B_9C/B_4C$ and n-type Si/SiGe legs. Another preferred choice is n-doped Si/SiGe for the n-legs and p-doped Si/SiGe for the p-legs. At higher temperatures the preferred quantum well legs are alternating layers of silicon and silicon carbide for the n-legs and for the p-legs alternating layers of different stoichiometric forms of B-C.

6 Claims, 17 Drawing Sheets

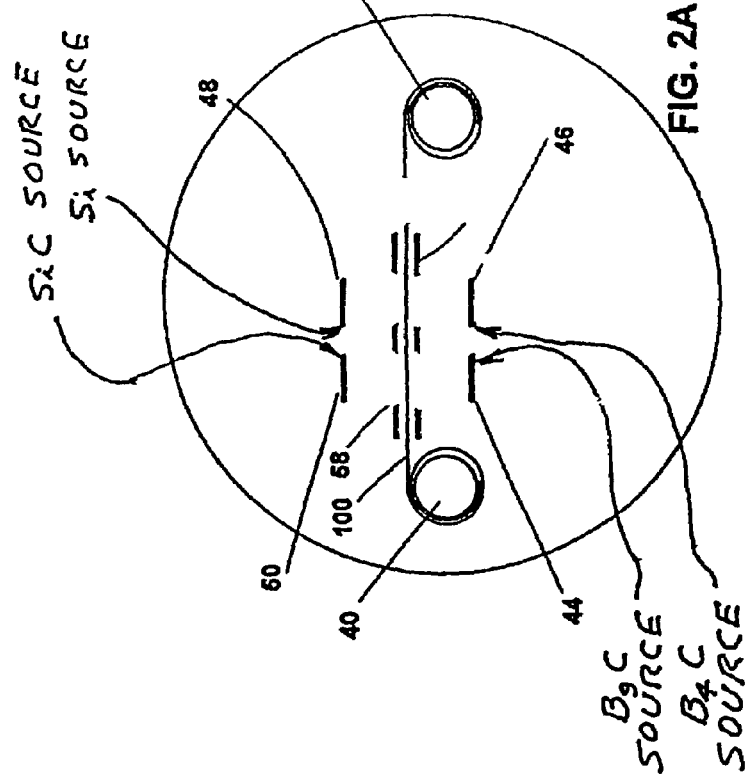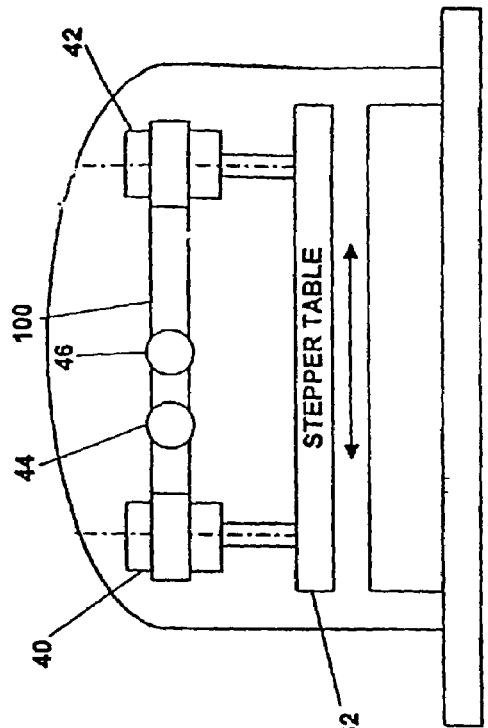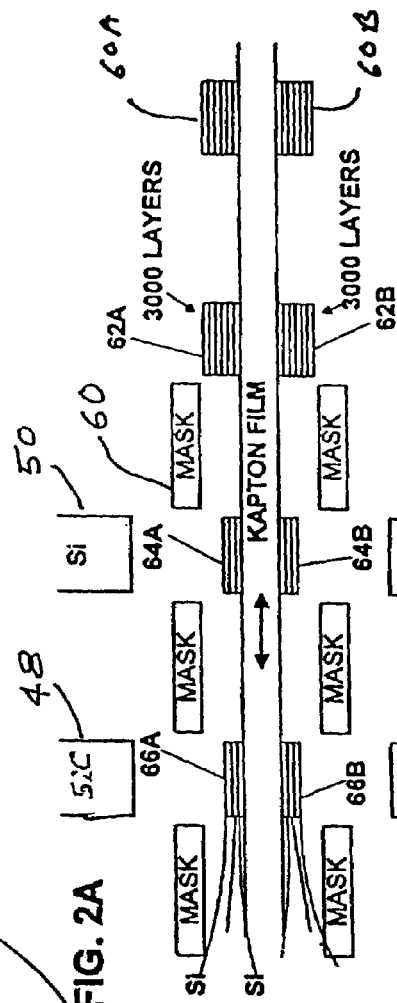

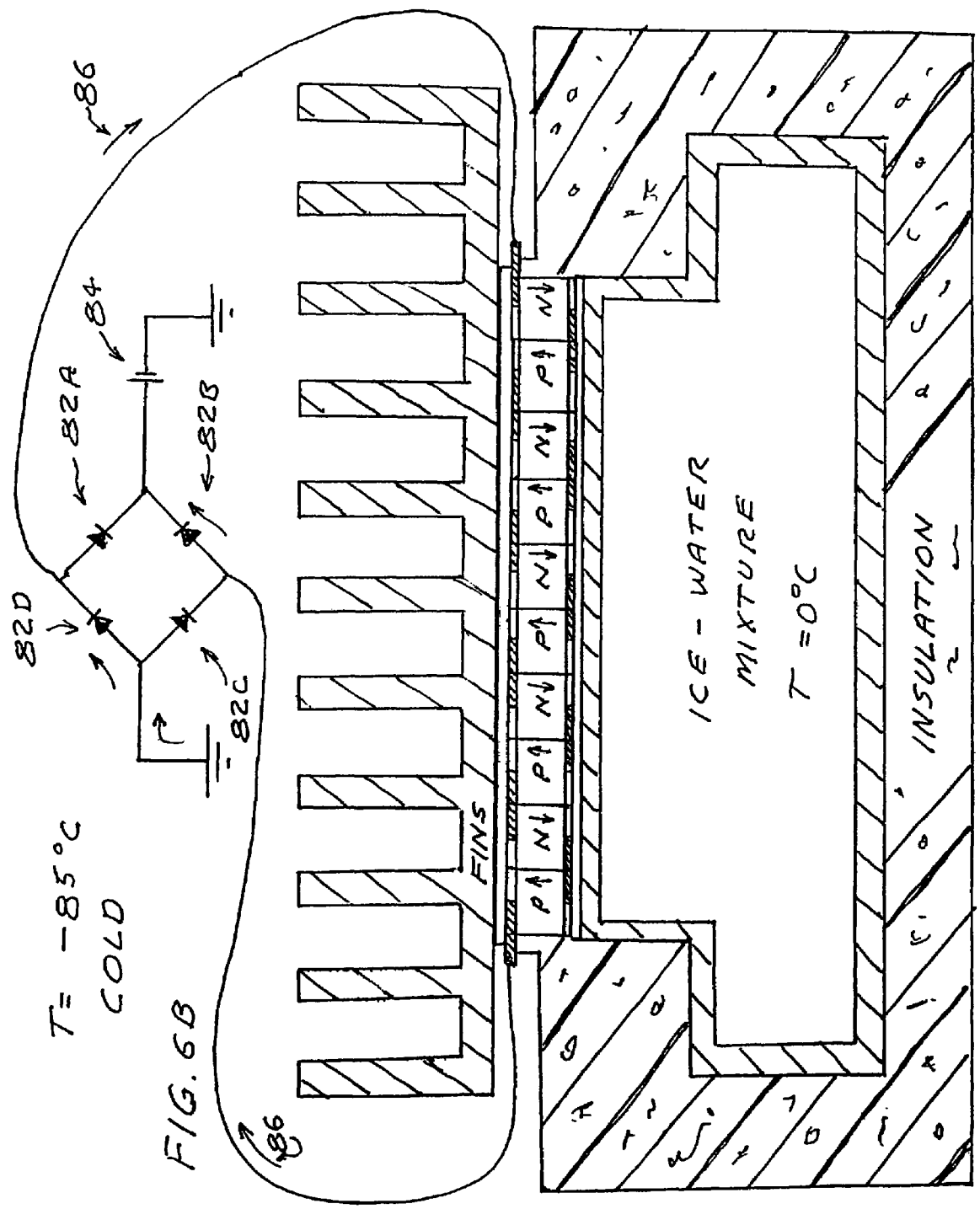

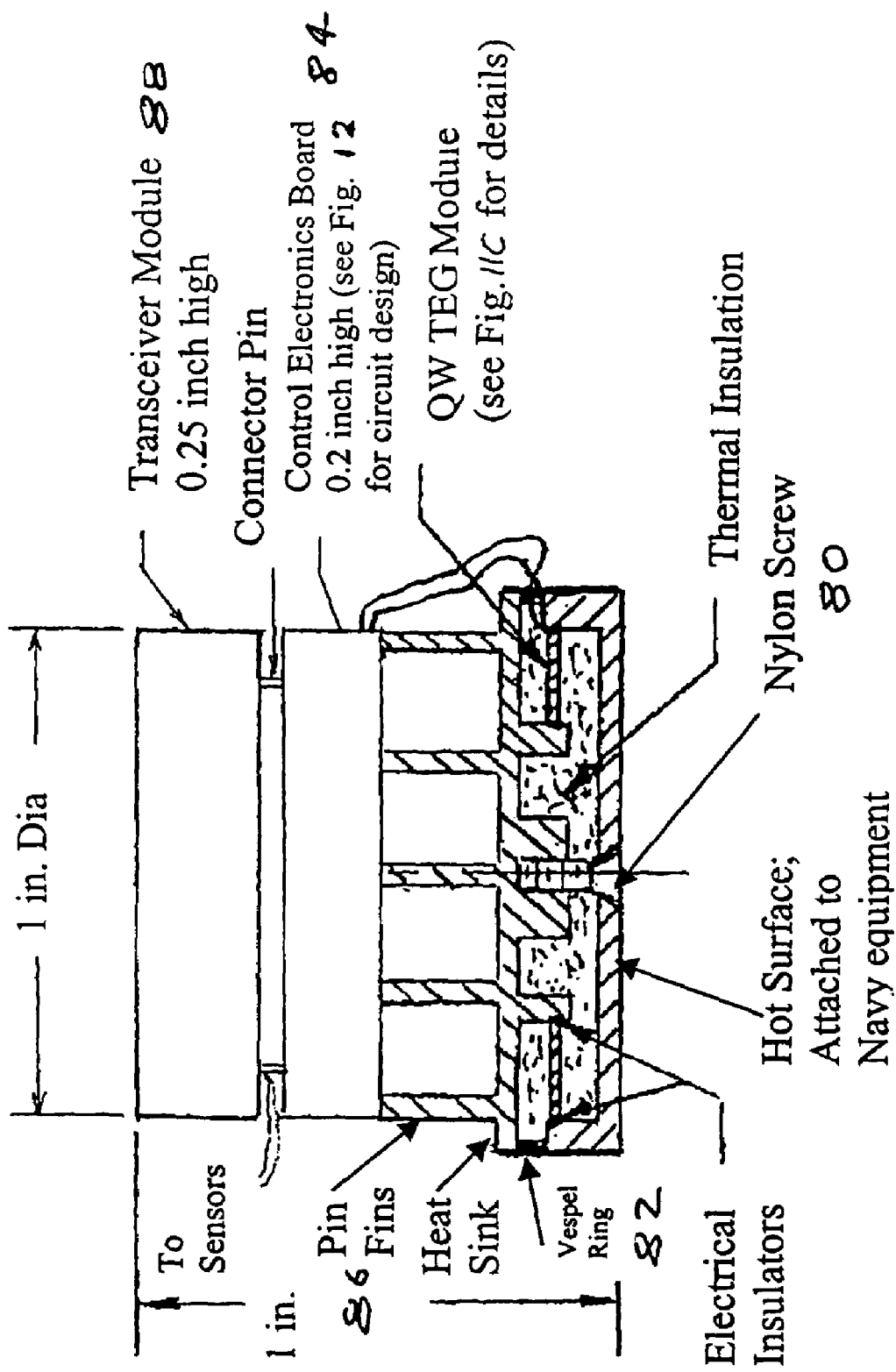

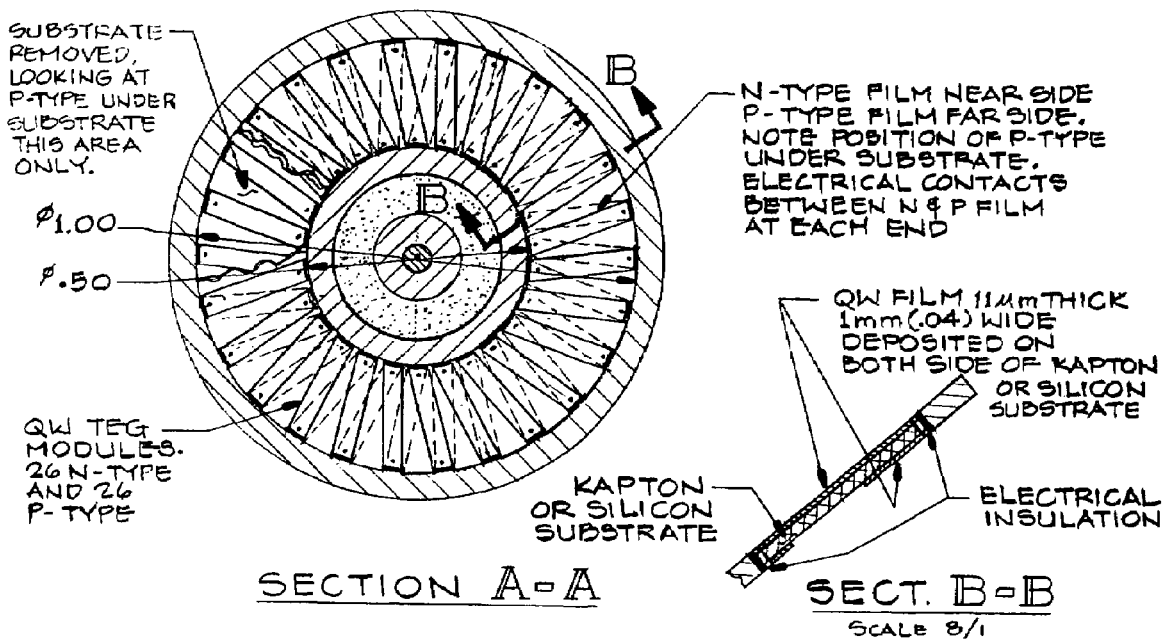
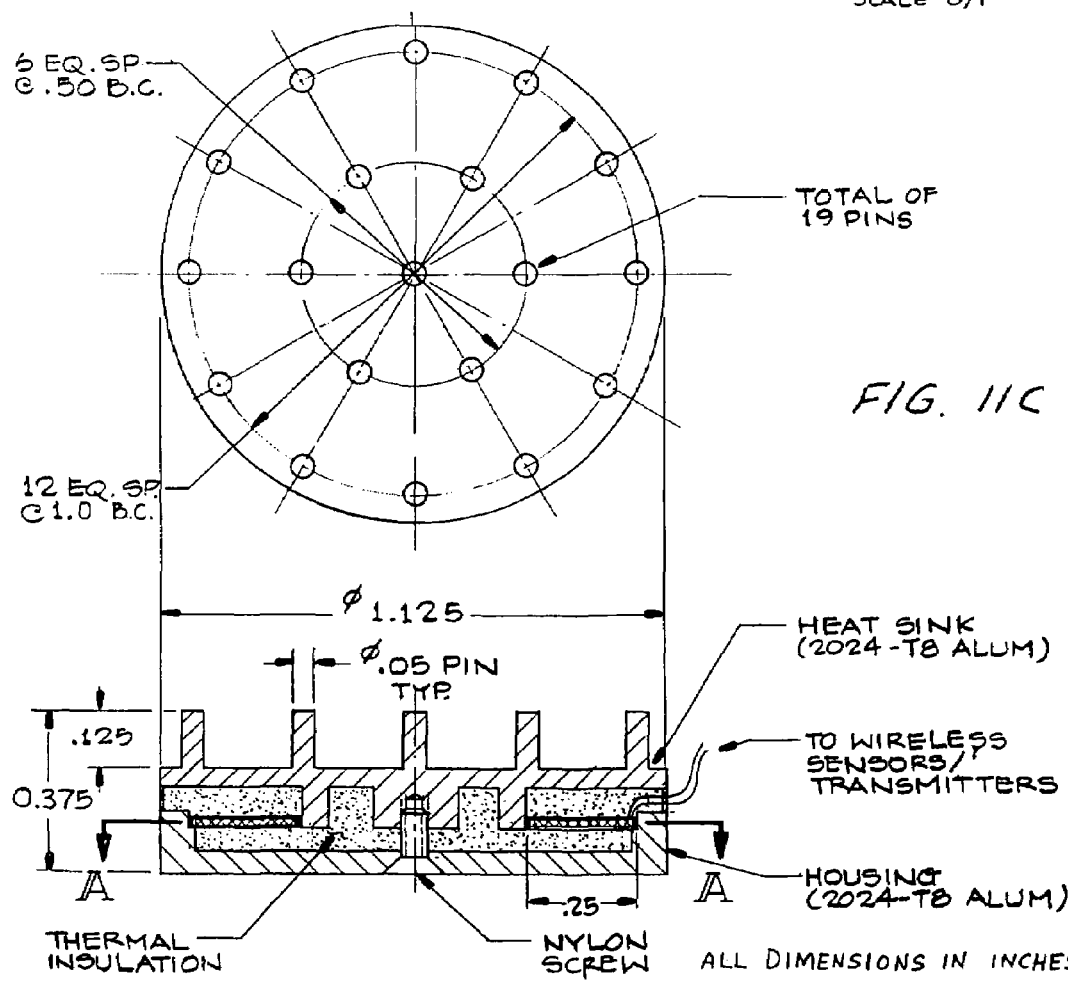
FIG. 11C

QUANTUM WELL THERMOELECTRIC POWER SOURCE

This application is a continuation in part of Ser. No. 10/734,336 filed Dec. 12, 2003 now U.S. Pat. No. 6,914,343, and Ser. No. 10/021,097 filed Dec. 12, 2001 now U.S. Pat. No. 6,828,579 which is incorporated herein by reference and also claims the benefit of Provisional Application Ser. No. 60/632,639 filed Dec. 2, 2004. The present invention relates to thermoelectric devices and in particular techniques for producing electric power from existing heat sources and to very thin lattice thermoelectric devices. This invention was made in the course of or under Contract Number N00178-03-C-3018 with the US Naval Surface Warfare Center and the US Government has rights under any patent resulting from this application.

BACKGROUND OF THE INVENTION

A well-known use for thermoelectric devices is for the extraction of electric power from waste heat. For example, U.S. Pat. No. 6,527,548 discloses a self powered space heater for a truck in which heat energy for the heater is used to power electric components of the heater plus charge a battery. In U.S. Pat. No. 6,053,163 heat from a stovepipe is used to generate electricity. U.S. Pat. No. 6,019,098 discloses a self-powered furnace. Various types of thermoelectric modules are available. A very reliable thermoelectric module with a gap-less egg-crate design is described in U.S. Pat. Nos. 5,875,098 and 5,856,210. U.S. Pat. No. 6,207,887 discloses a miniature milli-watt thermoelectric module useful in space applications (and special applications on earth) in combination with radioactive heat source. Quantum well very thin layer thermoelectric modules are known. Some are described in U.S. Pat. Nos. 6,096,965, 6,096,964, 5,436,467 and 5,550,387. U.S. Pat. No. 6,624,349 describes an electric generator using a thermoelectric module to generate electric power from the heat of fusion produced by the freezing of a phase change material. All of these patents are assigned to Applicant's employer and they are all incorporated herein by reference.

Workers in the thermoelectric industry have been attempting too improve performance of thermoelectric devices for the past 20-30 years with not much success. Most of the effort has been directed to reducing the lattice thermal conductivity (K) without adversely affecting the electrical conductivity. Experiments with superlattice quantum well materials have been underway for several years. These materials were discussed in an paper by Gottfried H. Dohler which was published in the November 1983 issue of Scientific American. This article presents an excellent discussion of the theory of enhanced electric conduction in superlattices. These superlattices contain alternating conducting and barrier layers and create quantum wells that improve electrical conductivity. These superlattice quantum well materials are crystals grown by depositing semiconductors in layers each layer with a thickness in the range of a few to up to about 100 angstroms. Thus, each layer is only a few atoms thick. (These quantum well materials are also discussed in articles by Hicks, et al and Harman published in Proceedings of 1992 1st National Thermoelectric Cooler Conference Center for Night Vision & Electro Optics, U.S. Army, Fort Belvoir, Va. The articles project theoretically very high ZT values as the layers are made progressively thinner.) The idea being that these materials might provide very great increases in electric conductivity without adversely affecting Seebeck coefficient or the thermal conductivity. Harmon of Lincoln Labs, operated by MIT has claimed to have produced a superlattice of layers of (Bi,Sb) and Pb(Te,Se). He claims that his preliminary measurements suggest ZTs of 3 to 4. FIG. 1 shows theoretical calculated values (Sun et al—1998) of ZT plotted as a function of quantum well width.

Most of the efforts to date with superlattices have involved alloys that are known to be good thermoelectric materials for cooling, many of which are difficult to manufacture as superlattices. FIGS. 1A and 1B herein were FIGS. 3 and 5 of the "467 patent referred to above. A large number of very thin layers (in the '467 patent, about 250,000 layers) together produce a thermoelectric leg 10 about 0.254 cm thick. In the embodiment shown in the figures all the legs are connected electrically in series and otherwise are insulated from each other in an egg-crate type thermoelectric element as shown in FIG. 1A. As shown in FIG. 1B current flows from the cold side to the hot side through P legs and from the hot side to the cold side through N legs. (Electrons flow in the opposite direction.) These patents disclose superlattice layers comprised of: (1) SiGe as conducting layer and Si as a barrier layer and (2) alternating layers of two different alloys of boron carbide. In the '387 patent Applicants disclose that they had discovered that strain in the layers can have very beneficial effects on thermoelectric properties of the elements disclosed in the '467 patent.

Monitors for collecting and transmitting information from remote locations must have a power source. In some cases power can be supplied a battery, solar cell or an electric power utility source. Batteries have to be replaced periodically. Many locations do not have sunlight and in many locations bringing in power from the power company can be very expensive. Often where the monitor is to be needed in a location where a heat source is available. Many monitors with transmitters require very small amounts of power.

Large engine driven vehicles such as ships of the United States Navy require numerous monitors in location where electric power is not readily available. These vehicles do in many cases have heat sources available where the monitors are needed. A good example is gas turbine equipment providing power for AC&R/HVAC).

What is needed is a better technique for producing very efficiently small amounts of electric power in very isolated locations.

SUMMARY OF THE INVENTION

The present invention provides a quantum well thermoelectric module providing very high conversion of heat energy in to electrical energy. In prefered embodiments the module provides electric power for monitoring, measuring or detecting any of a variety of things (such as temperature, smoke, other pollution, flow, fluid level and vibration) and a transmitter for transmitting information measured or detected. In a preferred embodiment wireless monitor systems are utilized to monitor conditions at various locations aboard a ship and to wirelessly transmit information about those conditions to a central location. Preferably, a finned unit is provided to efficiently transfer heat from a module surface to the environment. A preferred quantum well choice is p type $B_9C/B_4C$ and n-type Si/SiGe legs. Another preferred choice is n-doped Si/SiGe for the n-legs and p-doped Si/SiGe for the p-legs. At higher temperatures the preferred quantum well legs are alternating layers of silicon and silicon carbide for the n-legs and for the p-legs alternating layers of different stoichiometric forms of B-C.

BRIEF DESCRIPTION OF THE DRAWINGS

FIG. 2A is a top view of a preferred deposition chamber for fabricating thermoelectric film.

FIG. 2B is a side view of a preferred deposition chamber for fabricating thermoelectric film.

FIG. 3 shows an enlarged view of a section of Kapton® tape with alternating layers attached.

FIGS. 6A and 6B show the operation of a preferred embodiment of the present invention.

FIG. 11A is a drawing of a preferred embodiment of the present invention.

FIG. 11C is a detailed drawing of the preferred embodiment of the present invention.

DETAILED DESCRIPTION OF PREFERRED EMBODIMENT

Quantum Well Thermoelectric Modules

Figure 1A:
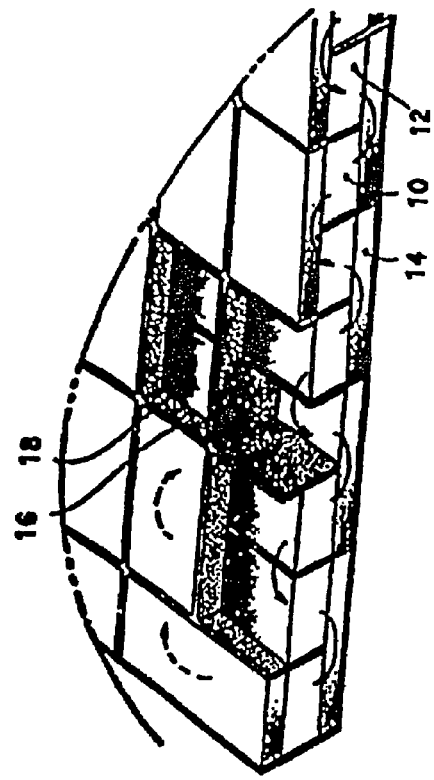
FIGS. 1A and 1B show features of prior art thermoelectric modules.
Figure 1B:
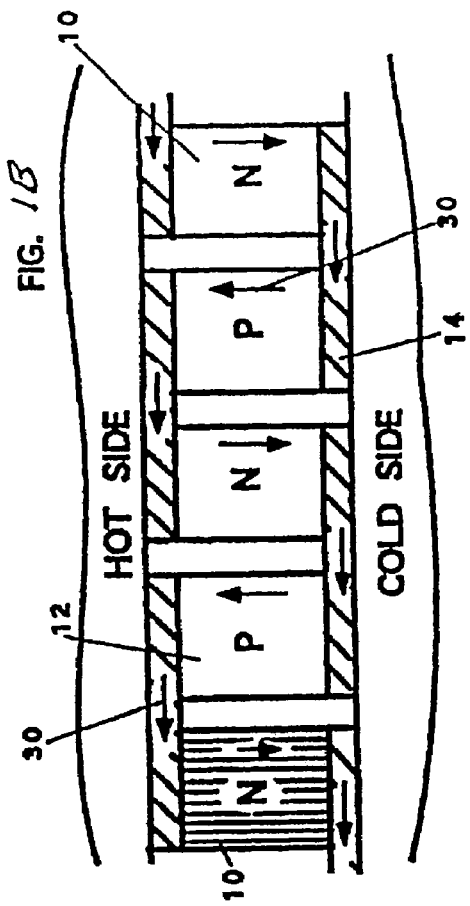
Figure 1:
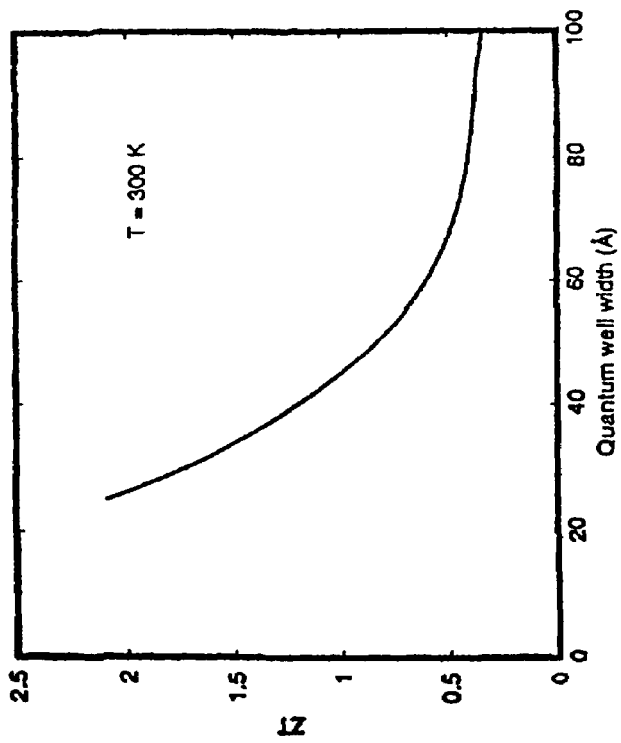
FIG. 1 is a graph showing theoretical values of ZT as a function of quantum well width.

The embodiments described uses conventional thermoelectric modules that have been available for many years. These modules are extremely reliable, many providing power for decades in space applications. Therefore, as of today they are the natural choice for applications where efficiency is not too important and cost is important. However, for future application or applications requiring very high efficiency a better choice may be quantum well thermoelectric modules. Some of these modules are described in the following sections.

Applicants Earlier Patents

On Aug. 1, 2000 Applicants were granted U.S. Pat. Nos. 6,096,964 and 6,096,965 both of which have been incorporated herein by reference. In these patents Applicants disclose techniques for placing the thin alternating layers on film substrates to produce quantum well thermoelectric modules. In these patents the alternating layers specifically described include layers comprised of silicon and silicon-germanium. The silicon is referred to as barrier layers and the SiGe layers are referred to as conducting layers and are appropriately doped to produce n legs and p legs.

An n-doping atom is typically the atom having one more electron than the base semiconductor atoms. The extra atom provides a conducting electron supporting current flow. A p-doping atom is typically the atom having one fewer electron than the base semiconductor atoms. The missing electron becomes an electron acceptor location (i.e., a hole) supporting current flow. As explained in the Dohler article, in these very thin layers electrons made available for conduction in the n-doped conduction layer can migrate to the boundary layer to make conduction possible there. Applicants believed that the excellent conducting properties of these materials are due to the fact that conduction can take place through the boundary layer crystals without being impeded by ions in the crystals which produce electrostatic fields which impede the flow of electrons. The same reasoning applies to the p-doped layers. In this case excess electrons migrate from the boundary layers to the p-doped conduction layers to produce holes in the boundary layers without current impeding ions. Thus, resistance to current flow is enormously reduced. Some materials possess thermoelectric properties without doping. In the '387 patent Applicants disclose that the layers of boron-carbide would make very good thermoelectric material especially for the p-type legs. GeTe and PbTe were also proposed as possible materials for the T/E elements.

Although the SiGe/Si superlatice material performs very well at low and moderate temperatures, performance above about 250 C is not much better than bulk SiGe alloys. Applicants' boron carbide quantum wells perform very well at low temperature and high temperatures as p-legs and but do not perform well as n-legs. It is for this reason that Applicants investigated and subsequently discovered the very good thermoelectric properties of Si/SiC material. A preferred embodiment of the present invention provides p-legs and n-legs that perform very well at high temperatures with an expectation that thermoelectric modules using these two legs will have module efficiencies of about 30% to 40%.

Applicants' Experiments

Applicants experiments have shown extraordinary promise for thermoelectric couples based on multilayer B4C/B9C films. The power delivered into a matched load, at the level of a fraction of a microWatt, appears small, but is produced from a very small amount of active material. The efficiency calculated for each couple depends on the value taken for the thermal conductivity. If we assume no enhancement of the thermal conductivity, i.e. take the value for bulk $B_4C/B_9C$, the efficiency is about 4% for the lower temperature (90 degree C.) heat source and 10-11% for the 250° C. heat source. These figures are already a significant improvement over bismuth telluride and improve with the low thermal conductivity measurements of UCLA as discussed below. The power factor numbers ($\alpha^2/\rho$) indicate that there is some quantum well confinement in the $B_4C/B_9C$. The Applicants' data have been confirmed by similar measurements at the Naval Research Laboratory.

The Seebeck coefficient does not change with the relative thickness of the Si substrate since this parameter is independent of thickness. However, as the Si substrate thickness is reduced, the ratio of the film resistance to the substrate resistance is increasing. Since the resistance of the film is so much lower than the Si substrate, the composite resistivity will drop as the substrate thickness decreases.

Si/SiC

Recent test results by Applicants indicate that Si/SiC multi-layer films exhibit very favorable Seebeck coefficient ($\alpha$), resistivity ($\rho$) (see Table I) and power factor ($\alpha^2/\rho$) values as shown in Table I. If their thermal conductivity values are low over the full operating temperature range, as expected for quantum well materials, the thermoelectric figure-of-merit should be close to that of $B_4C/B_9C$. Further, the power factor values are expected to increase with increasing temperature due to a decrease in resistivity and an increase in Seebeck coefficient. Si/SiC multilayer films are therefore highly promising for n-leg applications, offering prospects of both a high thermoelectric figure-of-merit and a high operating temperature, based on the refractory nature of silicon carbide. The Applicants are convinced that $B_4C/B_9C$—Si/SiC QW couples will exhibit module efficiencies much improved over prior art couples. They project module efficiencies of 30% to 40%, is a giant step in thermoelectric development.

Figure 5:
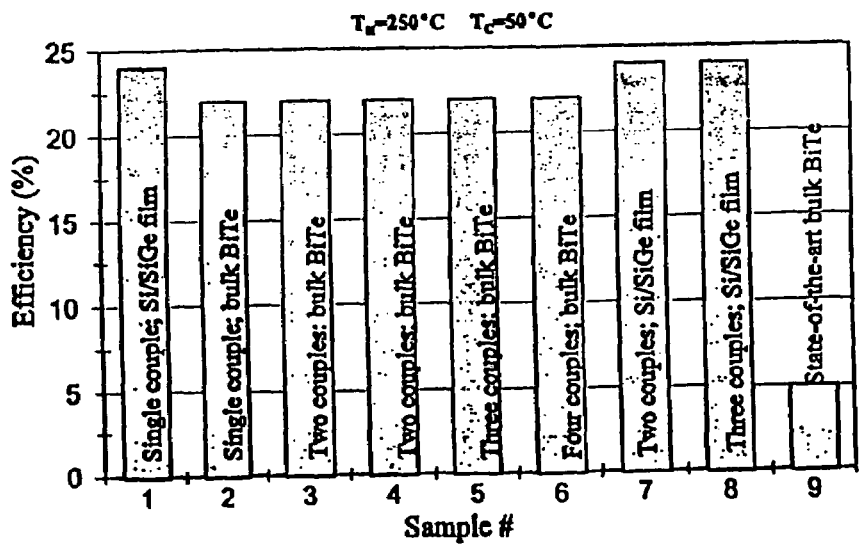
FIG. 5 shows Applicant's calculated efficiencies for several thermoelectric samples.

Measurements at UCLA indicate that the thermal conductivity of the B4C/B9C multi-layer films is significantly reduced in comparison with the bulk value. The use of the UCLA low value for the in-plane thermal conductivity leads to a factor of 3 enhancement in the performance (i.e., figure of merit) of the material. The data based on the assumption of the UCLA thermal conductivity value are also included in Table 1 and FIG. 5 and show the promise of this technology. Measurements at UCLA on multi-layer QW films of Si/SiGe also showed a reduction in thermal conductivity by about a factor 3 in comparison with bulk material. The measurement to date has been made only at room temperature.

Applicants' Demonstration Projects

Applicants have successfully produced Si/SiC multi-layer quantum well films. Magnetron sputtering was used to deposit films of SiC with Si as the barrier material, on silicon substrates. Films of individual layer thickness about 100 Å, and up to 10,000 Å in total thickness, were deposited. Applicants believe that this is the first time that multi-layer films of Si/SiC have been successfully deposited. Measurements on these materials indicated excellent resistivity and Seebeck coefficient values. Table 1 shows the thermoelectric properties of these films at room and higher temperatures. These numbers confirm the promise of this material combination, resulting from QW confinement of the carriers. Based on thermal conductivity measurements of Si/SiGe and $B_4C/B_9C$ films, which have a factor of 3-4 reduction versus bulk alloys, these multi-layer QW Si/SiC films are expected on theoretical grounds to show similar reductions in thermal conductivity. These experiments show that Si/SiC is a preferred choice for the n-leg of a highly efficient thermoelectric power conversion device.

TABLE I

| Temperature (° C.) | Resistivity (mΩ-cm) | Seebeck Coefficient (μV/° C.) |
|---|---|---|
| 25 | 2.15 | −750 |
| 250 | 1.71 | −1080 |
| 500 | 1.52 | −1240 |

Film deposition was performed using a Veeco magnetron sputtering unit at Hi-Z, with 3-inch targets, and side by side-sputtering using 2 or 3 inch targets at the University of California, San Diego (UCSD). Techniques were developed to control and measure the thickness of each layer, with a typical target of 100 Å per layer, deposited in about 1 minute. Deposition normally occurred on a [100] silicon wafer 3 inches in diameter. Some non-uniformity was noted around the edges of the wafer, so samples for measurement were taken from the central area. In the case of the B4C/B9C multi-layer films, annealing was performed prior to measurement.

$B_4C/B_9C$ and Si/SiC Superlattice Module

In this embodiment thermoelectric elements are made with p-type legs comprised of superlattices of alternating layers of $B_4C$ and $B_9C$ and n-type legs comprised of a superlattices of alternating layers of Si and SiC. Both $B_4C$ (as a p-leg) and SiC (as an n-leg) function as thermoelectric elements without added doping.

Making Thermoelectric Elements $B_4C/B_9C$ p-Legs and SiC/Si n-Legs

Figure 4B:
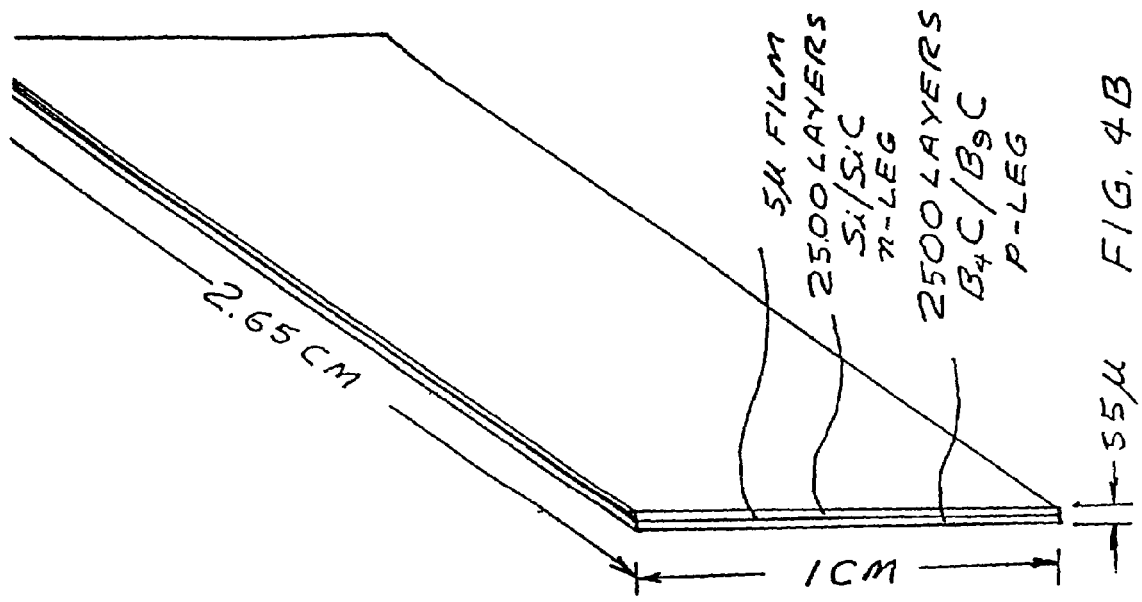
FIGS. 4A and 4B are views of a preferred thermoelectric couple.
Figure 4A:
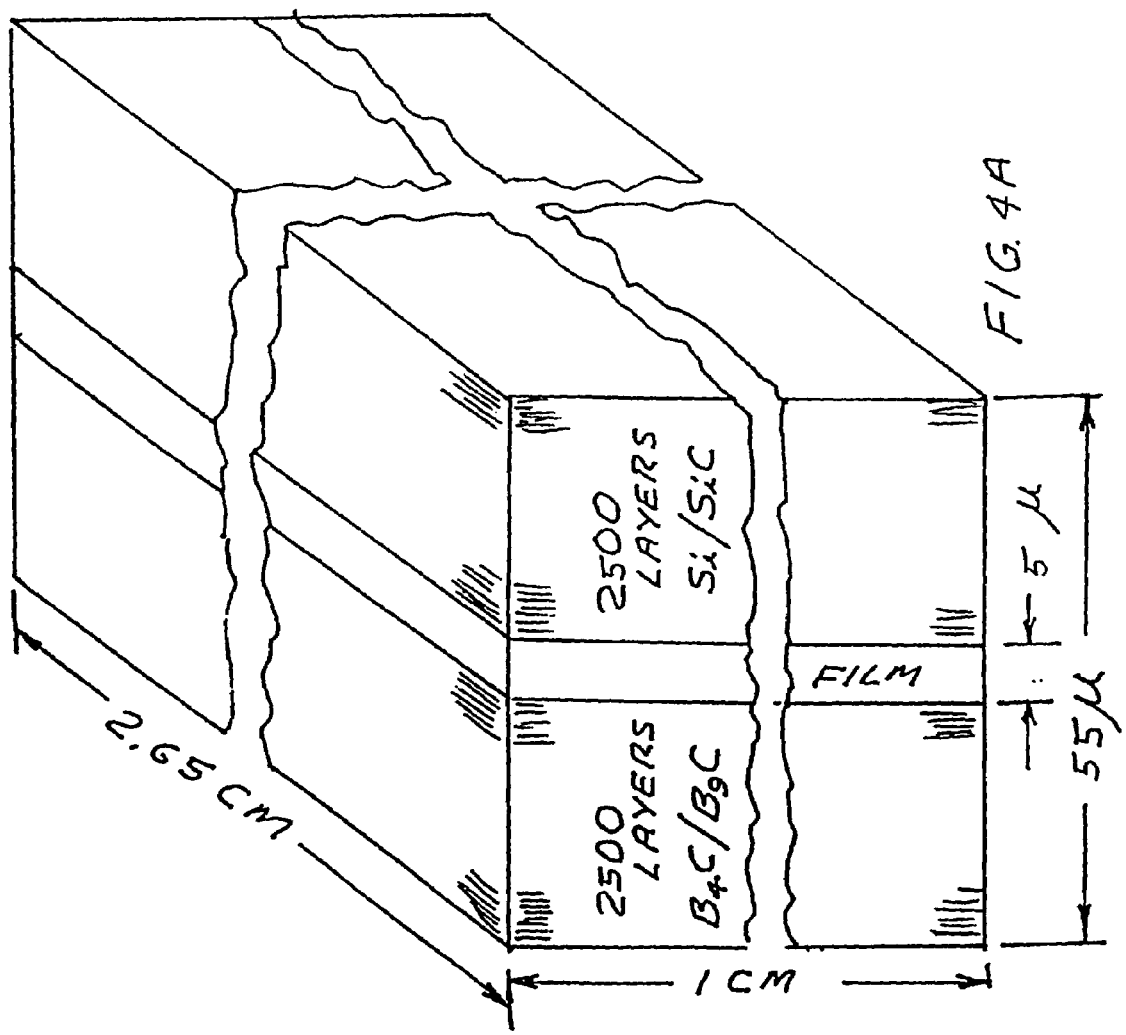

Preferred techniques for preparation of thermoelectric film can be explained by reference to FIGS. 2A through 4I. FIG. 2A is a top view of a preferred deposition chamber for fabricating thermoelectric film. FIG. 2B is a side view sketch. A roll 40 of plain Kapton® film coated on both sides with a 0.1 micron thick layer of crystalline Si feeds take-up roll 42. The coated film is about 2.5 microns thick. Alternate layers (10 nm thick) of $B_4C$ (as the "conducting" layers) and $B_9C$ (as the "insulating" layers) are deposited on one side of the tape from sources 44 and 46 and alternate layers of SiC (for the "conducting" layers) and Si (as the "insulating" layers) are deposited on the other side from sources 48 and 50. Stepper table 52 steps the tape back and forth so that 2500 layers of Si/SiC and 2500 layers of $B_4C/B_9C$ are deposited to form each thermoelectric element. FIGS. 4A and 4B show the dimensions of each thermoelectric element comprising one p-leg and one n-leg. The element has 2500 alternating layers of $B_4C/B_9C$ (1250 layers of each) for the p-leg and 2500 layers of Si/SiC (1250 layers of each) for the n-leg, each leg being separated by one layer of silicon film about 5 microns thick. Each of the 5000 layers are about 10 nm thick.

Figure 4C:
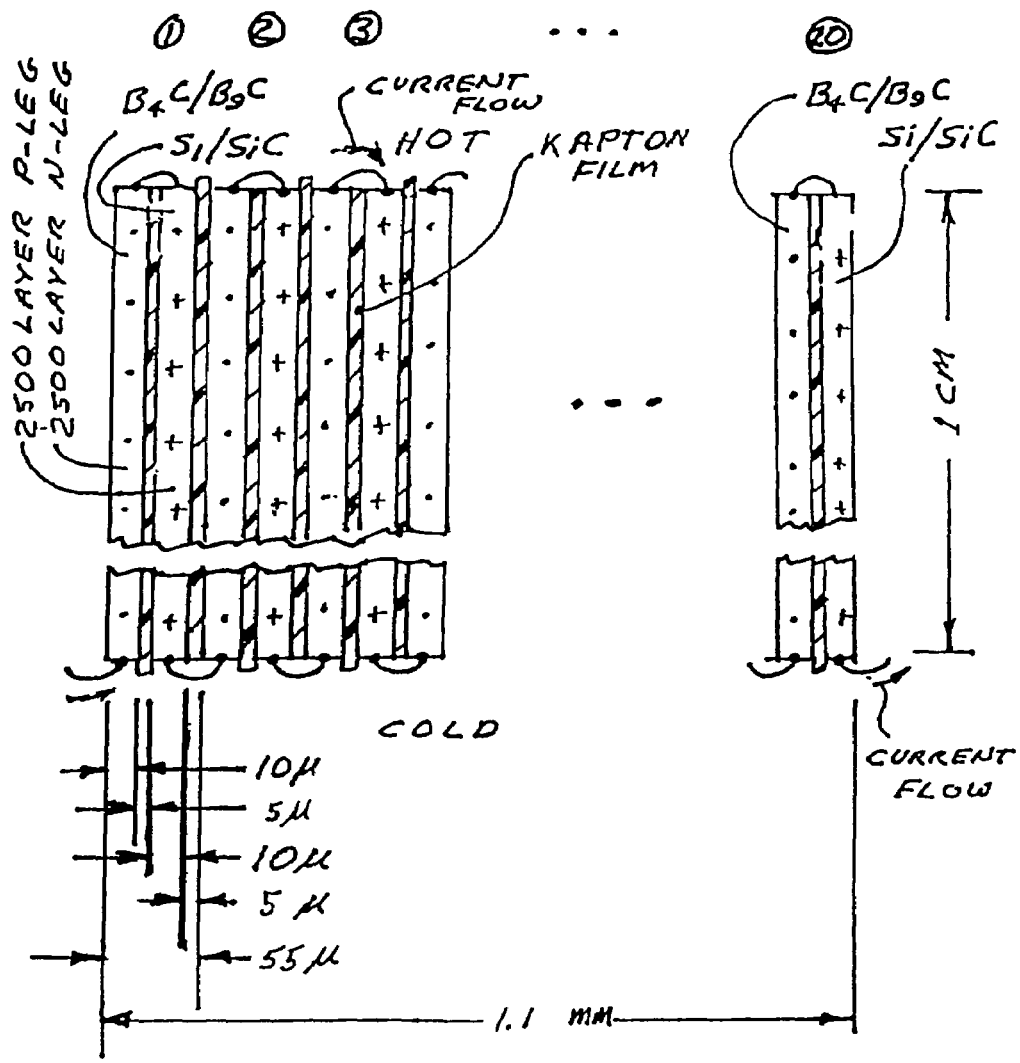
FIG. 4C shows a 20-couple thermoelectric set connected in series.

The alternating layers are 1 cm long and 2.65 cm wide so the completed element has the shape and size shown in FIG. 4B; i.e., 1 cm×2.65 cm×25 microns thick. Twenty of these elements are joined together with silicon film as shown in FIG. 4C to form a 20 couple thermoelectric set. The elements are connected in series as shown in FIG. 4C with a copper bond that may be made using a vapor deposition process. Note that the silicon insulating layers are allowed to extend beyond the thermoelectric material where the legs are not to be connected so the copper deposit can be uniformly applied then lapped until the separating insulator layers are exposed.

Each of the couples (one n-leg and one p-leg) will generate about 2 mV/degree C. So with a 300 degree C. temperature difference, the 20-element set will create a potential of about 12 Volts.

Figure 4D:
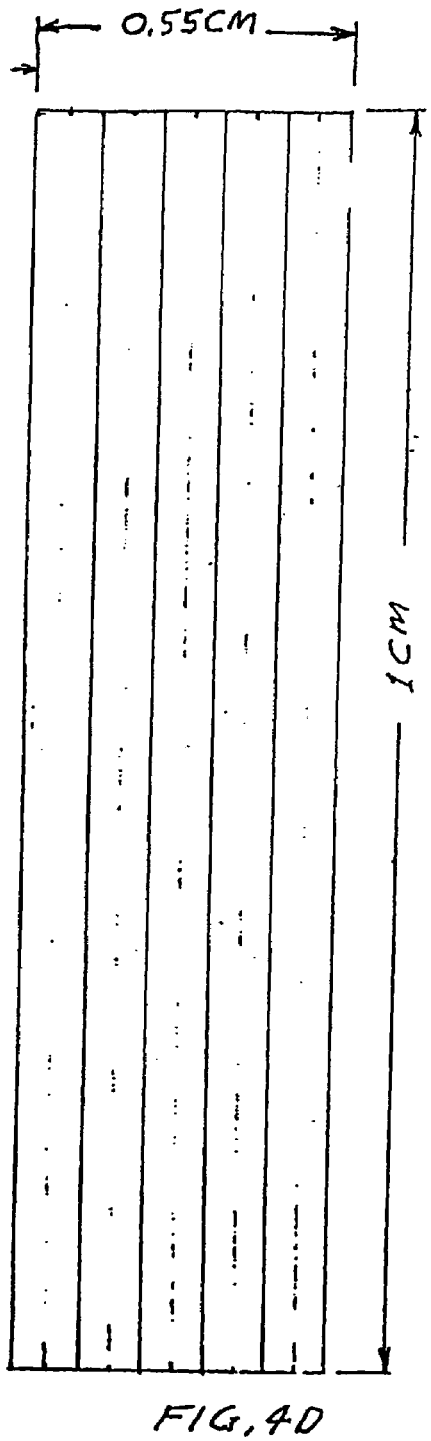
FIGS. 4D and 4E are views of a 100-couple thermoelectric set.
Figure 4E:
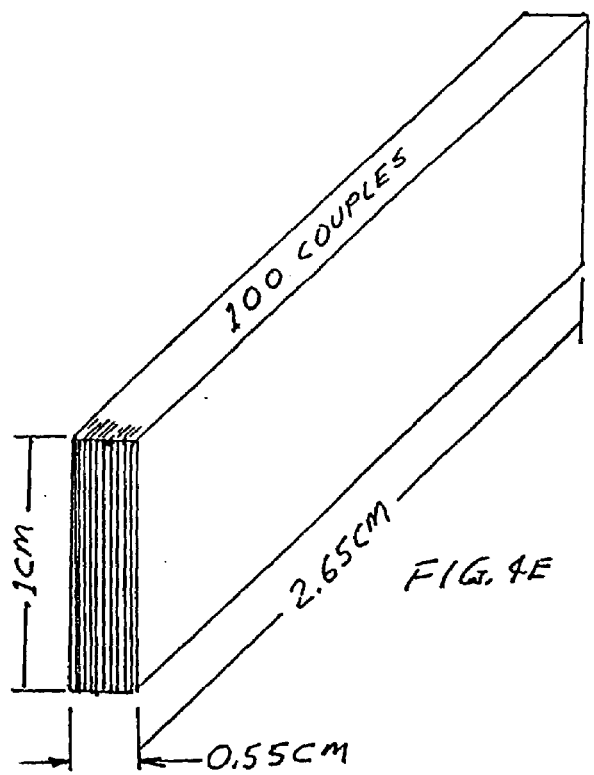

Five of these twenty couple thermoelectric sets are joined together as shown in FIG. 4D to form a 100 couple thermoelectric set but the five sets are connected in parallel so that the potential produced is still 12 Volts. This 100-element set is shown in prospective in FIG. 4E. The dimensions of this set are 1.0 cm×2.65 cm×0.25 cm.

Figure 4F:
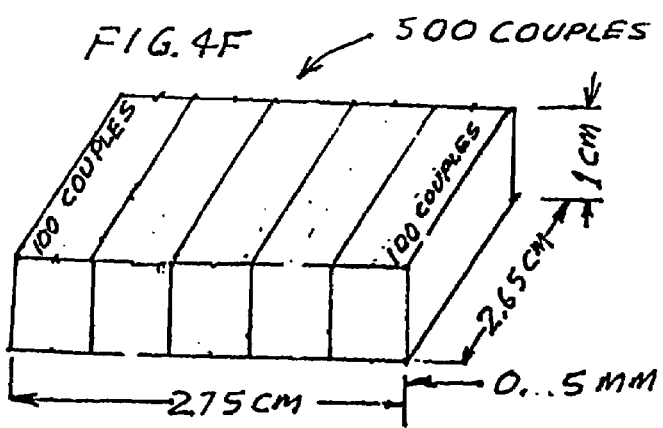
FIG. 4F is a sketch showing dimensions of a 1000 couple thermoelectric module.
Figure 4H:
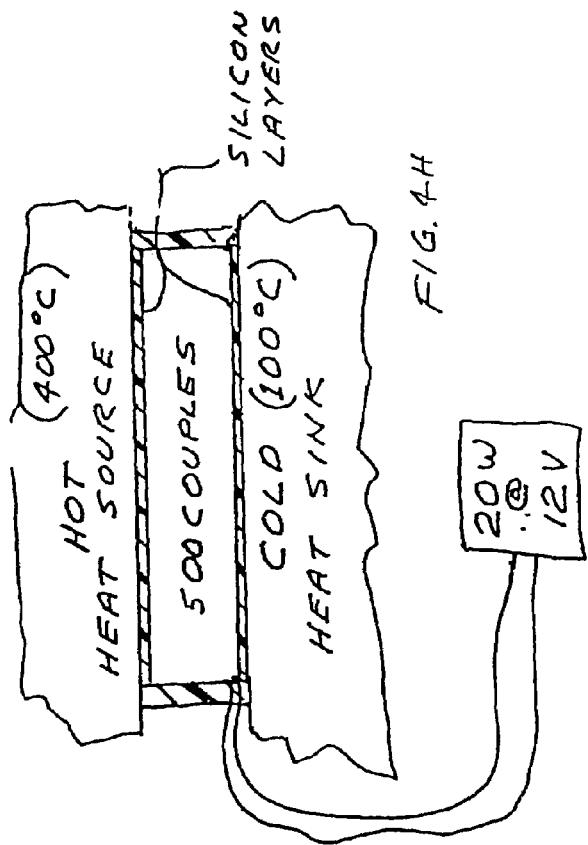
FIG. 4H shows the module in use.
Figure 4G:
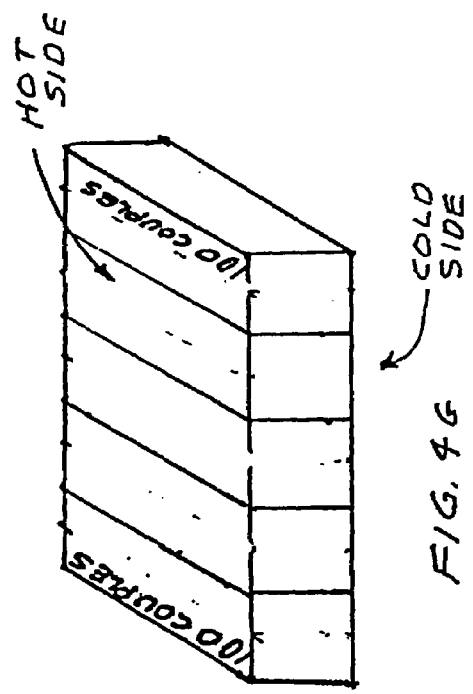
FIG. 4G is another view of the FIG. 4F module.
Figure 4I:
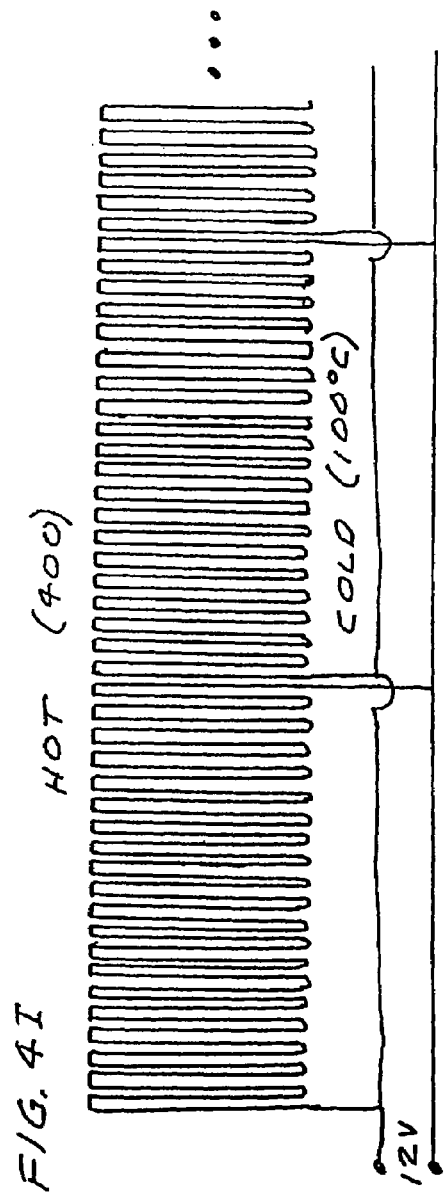
FIG. 4I shows how the legs of the module are connected electrically.

Finally five of these 100-element sets are joined to form a 500-couple thermoelectric module as shown in FIG. 4F which has the dimensions 2.65 cm×2.75 cm×1 cm. This module is mounted as shown in FIGS. 4G and 4H with each of the two 7 $cm^2$ sides positioned tightly against a hot heat source at 400 degrees C. and a cold heat sink at 100 degrees C. Again, the 100 element sets are connected in parallel so the voltage generated remains at about 12 Volts. The electrical connections are as shown in FIG. 4I.

SUBSTRATES

Substrates for Superlattice Thermoelectric Material

As described in U.S. Pat. '467, '387, '964 and '965, quantum well thermoelectric material is preferably deposited in layers on substrates. For a typical substrate as described in those patents, heat loss through the substrate can greatly reduce the efficiency of a thermoelectric device made from the material. If the substrate is removed some of the thermoelectric layers could be damaged and even if not damaged the process of removal of the substrate could significantly increase the cost of fabrication of the devices. The present invention provides a substrate that can be retained. The substrate preferably should be very thin, a very good thermal and electrical insulator with good thermal stability and strong and flexible.

Silicon

Silicon film is a preferred substrate material for depositing the Si/SiGe and $B_4C/B_9C$ layers. Si has also been used by Applicants as a substrate for depositing Si/SiGe alloys. Si is available commercially in films as thin as 5 microns from suppliers such as Virginia Simiconductor with offices in Fredricksburg, Va. By using a 5 micron substrate the amount of bypass heat loss can be held to a minimum. For commercial applications the quantum well film will be approximately 25 microns thick as explained above. Thus the ratio of quantum well thickness to substrate thickness is more than sufficient to greatly minimize by-pass heat losses. Si is also preferred because its 110 atomic orientation is well suited for the thermoelectric materials. The silicon film is stable at much higher temperatures than Kapton.

Kapton®

Kapton is a product of DuPont Corporation. According to DuPont bulletins:

Kapton® polyimide film possesses a unique combination of properties that make it ideal for a variety of applications in many different industries. The ability of Kapton® to maintained its excellent physical, electrical, and mechanical properties over a wide temperature range has opened new design and application areas to plastic films.

Kapton® is synthesized by polymerizing an aromatic dianhydride and an aromatic diamine. It has excellent chemical resistance; there are no known organic solvents for the film. Kapton® does not melt or burn as it has the highest UL-94 flammability rating: V-0. The outstanding properties of Kapton® permit it to be used at both high and low temperature extremes where other organic polymeric materials would not be functional.

Adhesives are available for bonding Kapton® to itself and to metals, various paper types, and other films.

Kapton® polyimide film can be used in a variety of electrical and electronic insulation applications: wire and cable tapes, formed coil insulation, substrates for flexible printed circuits, motor slot liners, magnet wired insulation, transformer and capacitor insulation, magnetic and pressure-sensitive tapes, and tubing. Many of these applications are based on the excellent balance of electrical, thermal, mechanical, physical, and chemical properties of Kapton® over a wide range of temperatures. It is this combination of useful properties at temperature extremes that makes Kapton® a unique industrial material.

Kapton® Substrate

Applicants have demonstrated that Kapton can be useful as a substrate film for superlattice thermoelectric layers when high temperature use is not planned. Kapton film is currently available in various thicknesses. Applicants have shown that a crystal layer laid down between the Kapton® substrate and the series of very thin conducting and barrier layers greatly improve thermoelectric performance especially for n-type layers. The preferred technique is to lay it on about 1000 Å thick in an amorphous form then to crystallize it by heating the substrate and the silicon layer to about 350° C. to 375° C. The crystalline layer should have the same crystalline structure as the layers.

Other Substrates

Many other organic materials such as Mylar, polyethylene, and polyamide, polyamide-imides and polyimide compounds could be used as substrates. Other potential substrate materials are oxide films such as $SiO_2$, $Al_2O_3$ and $TiO_2$. Mica could also be used for substrate. As stated above, the substrate preferably should be very thin a very good thermal and electrical insulator with good thermal stability, strong and flexible.

Other Lattice Materials

Many other thermoelectric materials may be used as p-legs along with Si/SiC n-legs. Superlattice materials are preferred. Measurements of thermal conductivity normally show a threefold reduction in QW films compared with bulk materials, as reported below. Applicants have found that Si/SiGe multi-layer films performed well at room temperature and below, but their performance at temperatures in the range of 250 degrees C. fell to that of bulk bismuth telluride.

First Preferred Embodiment

As explained above power generating capability of thin-film quantum well (QW) thermoelectric generators has been demonstrated in recent tests by Applicants where a high overall efficiency of 14% was measured. Higher efficiencies of 25% and 30% are theoretically possible with thicker QW films.

Figure 11:
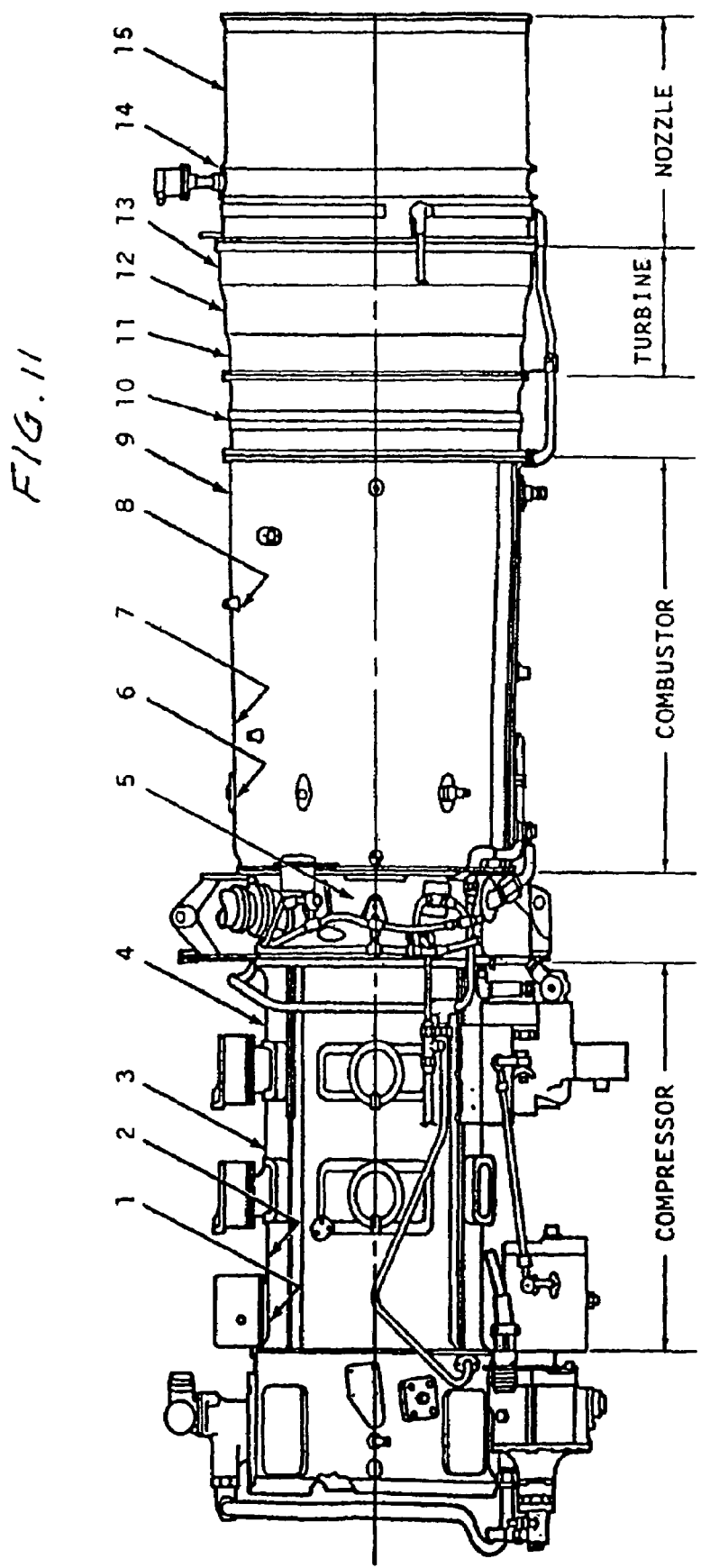
FIG. 11 is a drawing of a gas turbine.

The thermal environment selected for the design of a first preferred embodiment corresponds is the compressor section of an Allison 501-K34 gas turbine, as shown in FIG. 11. In addition to its good potential for power harvesting, this equipment surface was selected because of the availability of complete temperature data (both the equipment surface temperature and the adjacent ambient air temperature) so that no assumptions would be necessary in the design analysis. The surface temperatures at locations No. 2, 3, or 4 of FIG. 11 are 111.2° C., 221.1° C., and 342.2° C. These surface temperatures, in conjunction with the maximum ambient air temperature of 71° C. in this area, will provide adequate ΔTs for power harvesting. It should be noted that the given maximum ambient air temperature is the maximum allowable value and that the actual temperature should be lower, and that using the maximum allowable value in the thermoelectric generator sizing is conservative because it would under-predict the performance due to a lower than actual ΔT. Also, the outside diameter of the compressor section is 28 inches, which will allow for easy installation of the thermoelectric generator at this location. A 5 C temperature drop was assumed on the hot side and a 10 C on the cold side. The modules were originally sized for an output electrical power of 1 mW, which is adequate to charge the capacitor. Yet, the capacitor charging time can be substantially reduced by converting more of the available thermal potential in the shipboard environment into electrical power. Thus, in order to reduce the capacitor charging time, the thermoelectric generaqtor power output was increased to 10 mW. The generator open circuit voltage was assumed to be 6 V.

Figure 11B:
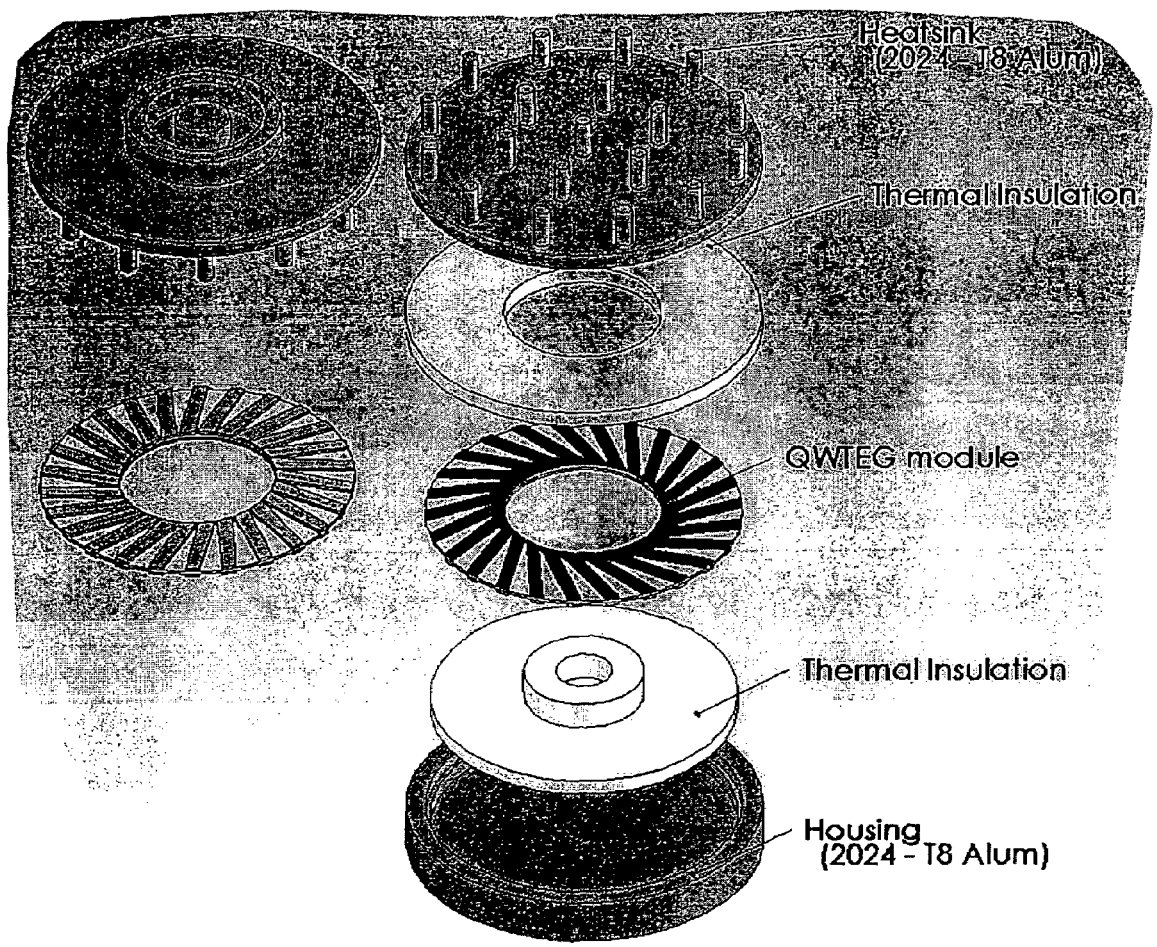
FIG. 11B is an expanded view of the FIG. 11A embodiment showing parts of the embodiment.

The results of the module sizing calculations indicated that each design was feasible regarding the maximum heat flux and manufacturing considerations. An example of a module design concept is shown in FIGS. 11A and 11B. This design is for the compressor location No. 4 (FIG. 11) and this module will produce 10 mW of electrical power at the open circuit voltage of 6 V. The module is in the form of a flat disk with a 1-inch O.D., an I.D. of 0.488 inch and a thickness of 0.001 inch. It will contain 26 semi-radial QW film legs with the N Si/SiGe film deposited on one side of the substrate and P Si/SiGe film on the other. These legs will be made by depositing the film through a mask. The legs will be made of multiple 100-Angstrom thick layers. The leg dimensions are shown in FIG. 11C.

Electric connections can be made by either depositing metal on the inner and outer edges of the disk or by a plated through hole at each end of each leg. Some applications require a much larger number of legs, which are typically narrower than shown in the FIG. 11C figures, and for such cases it may be preferable to use two or three sub-modules for the ease of manufacturing and making of electrical connections. The sub-modules will be stacked.

Figure 12:
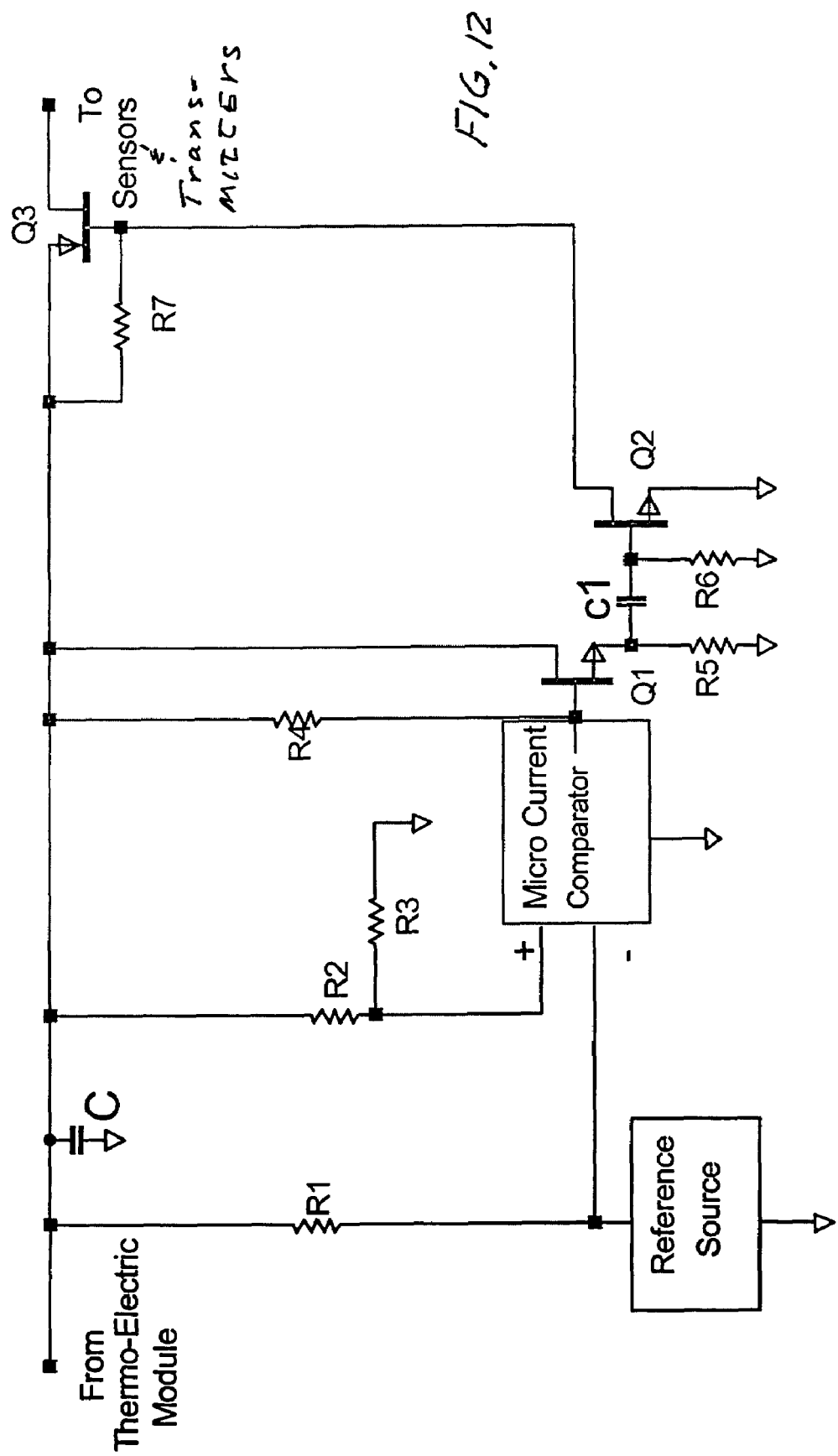
FIG. 12 is a circuit drawing of the electronics for the preferred embodiment.

A concept for the electronic control circuit is shown in FIG. 12. The thermoelectric generator has been designed for an open circuit voltage of 6 V and during operation the generator will charge the capacitor C toward a +6 V open circuit voltage. To reduce the charging time, the capacitor voltage is limited to +5 V. When the capacitor has reached this 5 V potential, the load switch will close and allow the sensors and transmitter to be activated. The design is based on sensor and transmitter units that can operate with a supply voltage in the range of +2 V to +5 V, as is the case with the majority of the off-the-shelf units. However, if some units require a fixed voltage, this can be accomplished with the use of a DC/DC converter, which can easily be added to the circuit design shown in FIG. 12 before the connection to sensors/transmitter. After the load switch is closed, the sensor/transmitter load can discharge the capacitor to +2 V, when the load switch will open and again allow the capacitor to charge to +5 V. An example of the times required to charge the capacitor and the operation times for the sensor/transmitter after each capacitor charging phase is presented in Tables 3 and 4.

TABLE 3

Capacitor C Charging Times for Different Capacitor Sizes

| Capacitor C Size (farads) | Charging Time (sec) |
|---|---|
| 0.01 | 15.2 |
| 0.02 | 30.5 |
| 0.03 | 45.7 |
| 0.04 | 61.0 |
| 0.05 | 76.2 |
| 0.06 | 91.5 |
| 0.07 | 106.7 |
| 0.08 | 122.0 |
| 0.09 | 137.2 |
| 0.10 | 152.4 |

TABLE 4

Transmission Time for Different Load Current Requirements

| Transmitter Load Current (mA) | Transmission Time (sec) | |
|---|---|---|
| | 0.01 farad Capacitor | 0.10 farad Capacitor |
| 0.05 | 613.0 | 6130.0 |
| 2.0 | 15.0 | 150.0 |
| 4.0 | 7.6 | 75.9 |
| 6.0 | 5.1 | 50.8 |
| 8.0 | 3.8 | 38.2 |
| 10.0 | 3.1 | 30.6 |
| 12.0 | 2.6 | 25.5 |
| 14.0 | 2.2 | 21.9 |
| 16.0 | 1.9 | 19.2 |
| 18.0 | 1.7 | 17.0 |
| 20.0 | 1.5 | 15.3 |

Quantum Well Power Harvesting System

A design for this QW TEG system is shown in FIGS. 11A and 11C. The main heat flow through this generator system is in the bottom and up the side, radially inward through the QW TEG module, up the center post to the heat sink above the module and into the pin fins where it is dissipated to the ambient air. A nylon screw 80 is used between the bottom hot surface and the heat sink in order to minimize the bypass heat losses. A thin ring 82, made of Vespel, or similar thermally insulating material, is used to separate the heat sink from the hot surface at the outer boundary in order to minimize the thermal bypass losses and to contain the internal thermal insulation. A control electronics board 84 and the transceiver module 88 are stacked above the pin fins 86. The transceiver module has a built-in temperature sensor and inputs for six sensors. It is 1 inch in diameter and 0.25 inch high and it weighs 3 grams according to the manufacturer, Crossbow Technology, Inc. It comes with 18 connector pins, which provide for convenient connection to the control electronics board. The height of the control electronics board is less than 0.2 inch and the board can be bonded to the pin fins with epoxy. The number of pin fins required to dissipate the heat depends on the application. For some applications no fins are required because for these applications the heat to be rejected is so low that natural convection from a one-inch disk is sufficient to dissipate the heat. For other applications, the required number of pin fins may range from 23 to 120 for pins with a 0.05-inch diameter. The fins can be made of aluminum and pin fins of this type are available from several manufacturers. For the applications requiring no fins, the power harvesting system can be packaged in a different configuration, so that the total volume would be substantially reduced.

The entire system can be attached to the compressor section of the gas turbine by either a clamp or a thermally conductive epoxy. If the clamp method is used, a thermally conductive pad or grease will be required between assembly and the compressor surface in order to minimize the contact thermal resistance and the temperature drop between the two surfaces.

Concept Feasibility Demonstration

Figure 13:
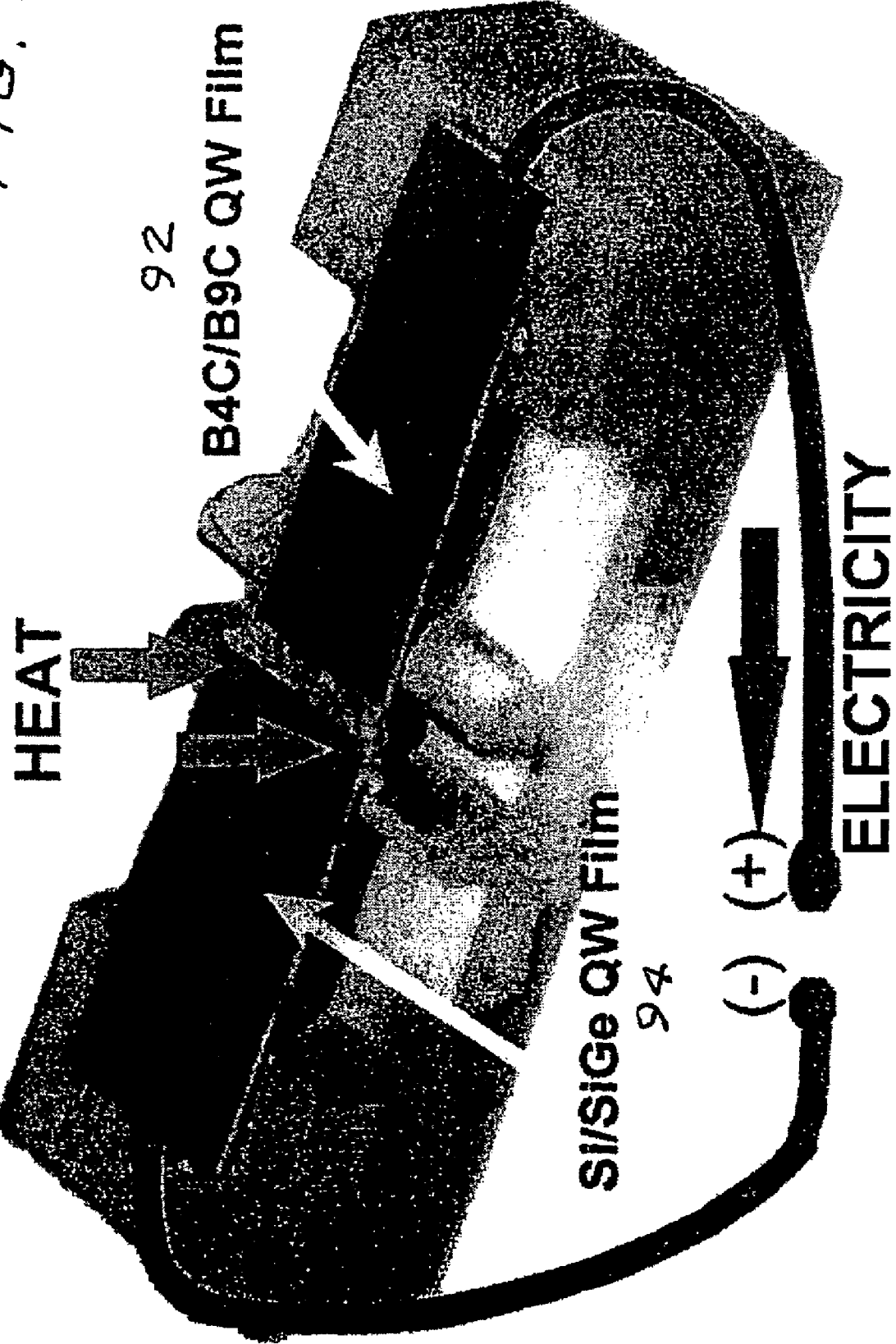
FIG. 13 is a drawing of a test setup to test quantum well thermoelectric couples.
Figure 14:
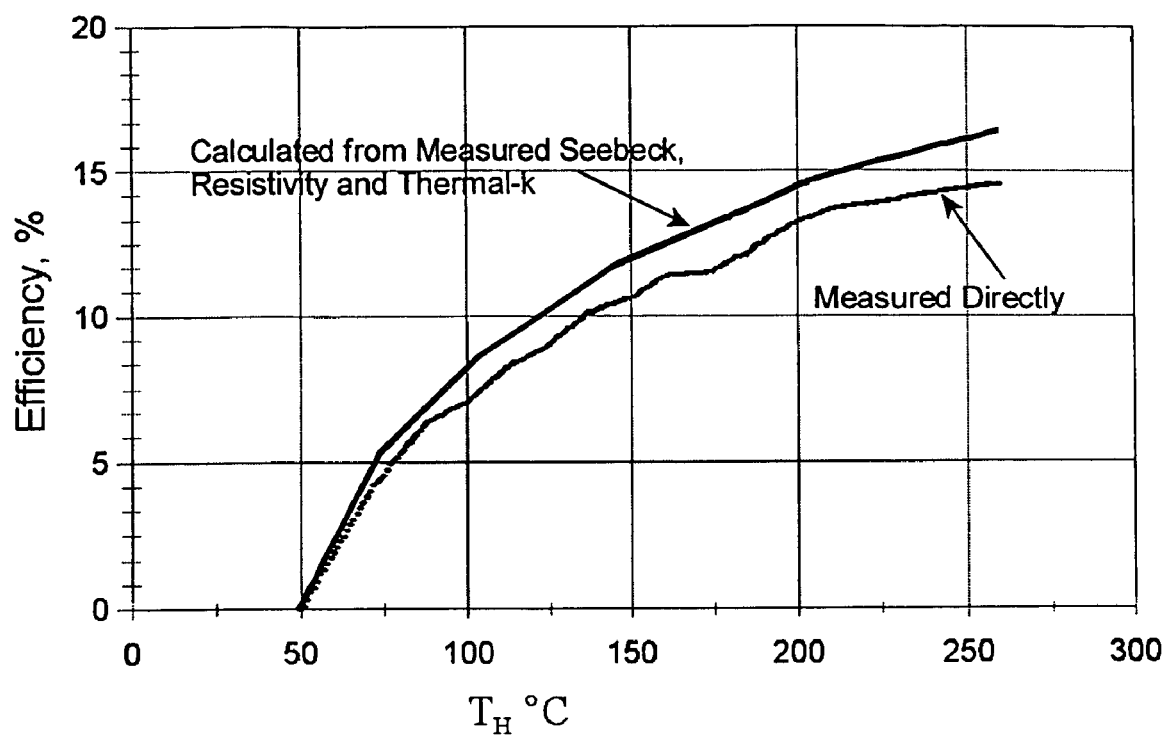
FIG. 14 shows efficiency of the test couple as a function of hot side temperature.

The power generating capability of thin-film QW TEGs has been demonstrated in tests completed by Applicants in May 2003. These tests not only verified the pre-test predictions, made and published by Applicants a few years ago, but they also demonstrated an efficiency of 14% which constitutes a breakthrough in thermoelectric performance which has so far been limited to an efficiency of approximately 5% for bismuth-telluride systems. The 14% efficiency was duplicated on a newly fabricated second cat couple was tested in the test holder 90 shown in FIG. 13. This couple operated between 50 C and 250 C and it was fabricated by Applicants and Applicants fellow workers on a 5 micron thick Si substrate with ~11 micron thick Quantum well film defining p-leg 92 and n-leg 94. The efficiency was calculated by dividing the measured electric power out of the couple by the measured electric power into the heater. This is a second device fabricated by Applicants that has exhibited the 14% efficiency. The 14% efficiency was obtained with no correction for any extraneous heat losses, such as through the Si substrate and the heater wires. The tests were performed at approximately one thousand temperature test points and the resulting efficiencies of this new device versus temperature are shown in FIG. 14. The maximum power generated by this test QW couple was 0.95 mW.

The results of these latest tests serve as the demonstration of the feasibility of the design concept, because the QW material thicknesses were the same, because these tests covered a wide range of $\Delta T$s that include the majority of the interior shipboard thermal environments and the $\Delta T$s used in this design, and because the test generated power levels are relevant to this application.

The conceptual design also satisfies the interface compatibility requirements (electrical and physical) of the sensor/transceiver units and the thermoelectric generator module. This was accomplished by integrating all of these components in one power harvesting system and by incorporating flexibility in the design of the control electronics so that they satisfy a range of different power and voltage requirements of different OEM sensor/transceiver designs. This design concept is for the worst-case conditions and it still satisfies the design volume target of one cubic inch.

The quantum well module shown in FIG. 11C was fabricated and tested by Applicants and it produced electricity when heat was applied to it.

Applications

Benefits to the Navy for using this concept are in cost reduction associated with the elimination of batteries and tethered wires, large reduction of personnel engaged in testing and significant reduction in down time by providing early detection of abnormal conditions in critical equipment. There is plenty of potential for power harvesting on Navy shipboard equipment because all that is required is a $\Delta T$ and a small surface area of the equipment for the attachment of the quantum well thermoelectric generator (QW TEG) with a footprint of one square inch. QW TEGs are also suitable for high temperature applications because they can withstand very high temperatures and they actually operate more efficiently at high $\Delta T$s. QW TEGs can be used at temperatures of up to 800° C.; they are typically annealed at 1000° C. for stress relief. This same power harvesting system can also be applied for health monitoring of the equipment on commercial ships. This system can be used in health monitoring of the aircraft and launch vehicle components where long data cables can be eliminated. There is also a potential application for health monitoring of the nuclear and steam power plant equipment where very long cables can also be eliminated.

Another health monitoring application would be for the Diesel and automobile engine equipment. Other applications are in the consumer appliance industry and security and surveillance industry. The QW TE technology also has wider applications, such as in cooling of electronic circuit boards. This emerging QW TEG technology could also be used to generate power on a much larger scale on the order of kilo Watts and several government agencies and private sector companies have expressed interest in its potential application. For example, the US Army has expressed interest in the potential application of this technology to provide a power source in the 500 W to 3 kW range for the tactical battlefield applications. Equipment suppliers have expressed a great interest in the application of the QW TEG power harvesting to provide power for auxiliary power units, charging of large batteries, and replacement of alternators. The QW technology is already commercially viable with the 14% efficiency. Once the higher efficiencies of over 20% become experimentally confirmed, the QW TE technology will become even more competitive in many commercial applications, such as refrigeration, where it will reach the state-of-the-art coefficient of performance of 3 and it will also have the distinct advantage of having no moving parts nor fluids.

Substrate Materials

While Applicants have successfully deposited multi-layer QW films on both silicon and Kapton substrates, the two materials have different properties that have direct impact on thermal bypass losses and efficiency, application temperatures, potential electrical shorting and manufacturing methods. These differences are discussed in more detail in this section.

Regarding the maximum application temperature, Kapton is limited to 400° C. while silicon can withstand much higher temperatures. In order to establish the maximum application temperature to be used in this Navy application, a discussion was held with Navy personnel, and it was decided that the majority of the applications will be for the equipment surfaces with temperatures lower than 400° C. and to use this temperature as the upper design limit. A power harvester for higher temperature applications can be designed as an option and this may be of interest to the Navy for other applications, particularly in conjunction with the use of the new QW film materials that show the potential for efficiencies above 40%.

As previously reported, the experimental couple used $B_4C$/$B_9C$ QW film for the P leg of the couple and Si/SiGe for the N leg. Both legs were deposited on a silicon substrate. Unlike $B_4C/B_9C$, the Si/SiGe material can be doped to be either N or P, and Hi-Z has already successfully deposited N and P SiGe films on Kapton substrates. This combination of materials (Si/SiGe on Kapton) considerably simplifies the design of a TEG module, particularly in the lower power ranges where a high element aspect ratio (length to cross-section area) is required, as is the case for the TEG module developed for this program. The disk type QW module on Kapton substrate lends itself to a much easier module fabrication technique. The circuitry required can be accomplished by one of several methods. One is photolithography. The other methods, which Applicants have proven in principle, are the use of the electron-discharge machining (EDM) and micro sandblasting. Applicants tried to EDM the contacts on the 40 mW bulk BiTe modules and found the EDM would not go through the Kapton because it is an insulator. This fact can be used in a plunge EDM process to make the circuit in the QW module because the plunge EDM will cut through the QW films but not the Kapton. In micro sandblasting performed in the development of the 40 mW modules, Applicants also found that Kapton was not easily removed by the process because it is more elastic than semi-conductor material. This indicates that one can place a metal mask over the QW film on Kapton and sandblast through slots in the mask to form the circuitry in the film and leave the Kapton insulator. There are a couple of disadvantages with the silicon substrate. First, it has a much higher thermal conductivity than Kapton resulting in higher thermal bypass losses. Second, it is conductive so that laying out a flat circular module in which the voltage increases as one goes around the circle will place a high voltage leg next to the lowest voltage leg and thus can lead to shorting because the distance between the high and low legs can be on the order of microns. One potential solution to this shorting problem is the deposition of a thin oxide layer on silicone prior to the QW film deposition; the oxide layer will act as an electric insulator. The methods of making circuitry on a disk type QW module with a silicon substrate may use some of the same techniques as in the Kapton substrate; however, they are less straightforward than with Kapton because silicon is conductive and can be easily eroded by sandblasting.

Thus, for this particular application, the Si/SiGe deposited on Kapton appears to have more advantages than the $B_4C/B_9C$ and Si/SiGe deposited on silicon. This has to be confirmed with tests.

Packaging Issues

It should be noted that the transceiver module and the control electronics board occupy approximately one half of the volume of the entire system shown in FIG. 11A and that significant reductions in the size of these components will result in the volume of the entire system being much less that one cubic inch. Three smaller transceiver modules were found in current trade journals. One is a wireless transceiver made by Radiotronix Corp. with the dimensions of 0.7×0.7×0.2 inch. The other module is even smaller, 9.3×7.8×1.8 mm. It is a Bluetooth module made by Murata Manufacturing Co., LTD., Part No. LMBTB044, and it is a new smaller size model of the LMBTB series of the Blue Module™. The third module is made by Broadcom Corp. The Raditronix module could be used but it does not provide much of a space saving over the Crossbow module used in the conceptual design (0.7-inch cross section vs. 1-inch diameter disk) and the Crossbow module has the advantage of having a built-in temperature sensor. The much smaller size of the Murata module would make it an attractive potential candidate for volume reduction of the entire power harvesting system. However, the smaller size of this module is more than offset by the large power consumption (120 mA at 3 V) which would necessitate much longer cooling fins in order to reject a much higher heat load, resulting in no improvement in the conceptual design. New smaller transceiver modules that become available during Phase II will be considered as a replacement of the Crossbow module provided that they have the suitable characteristics for health monitoring of the Navy shipboard equipment.

Thin Film Thermoelectric Legs

Figure 10A:
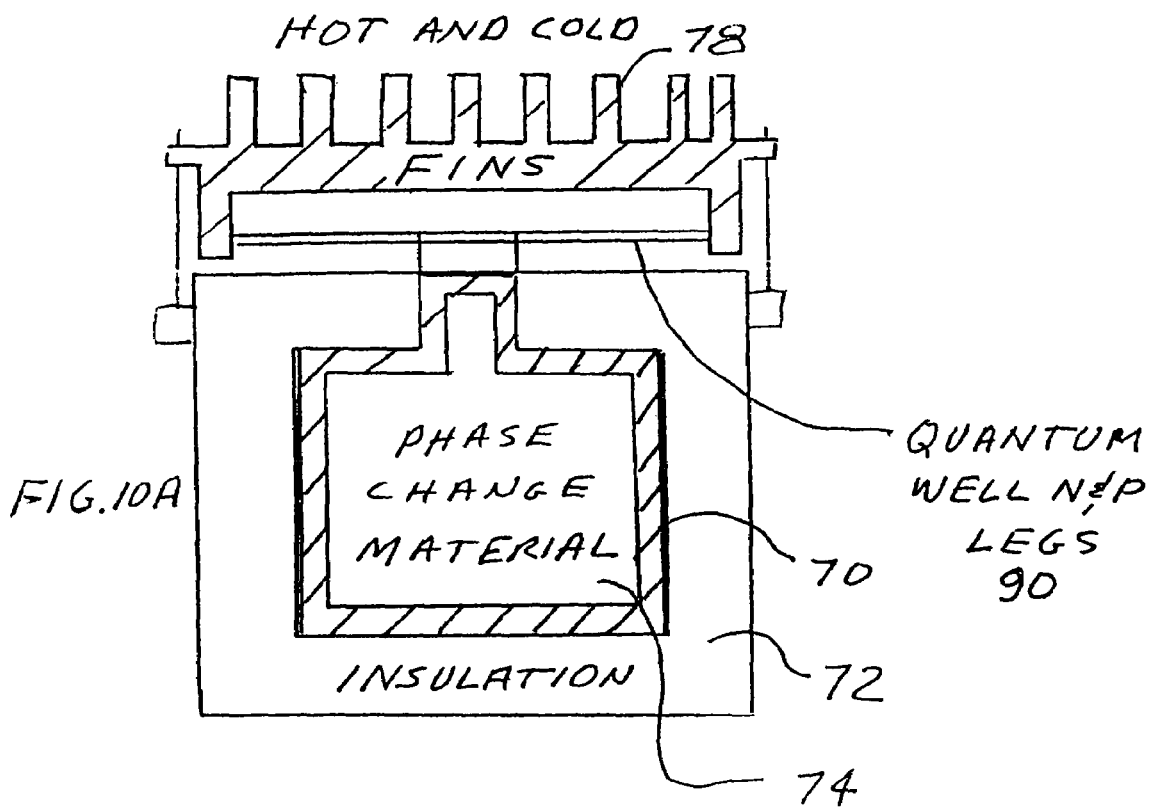
FIGS. 10A and 10B show a preferred embodiment of the present invention that utilizes quantum well thermoelectric material.
Figure 10B:
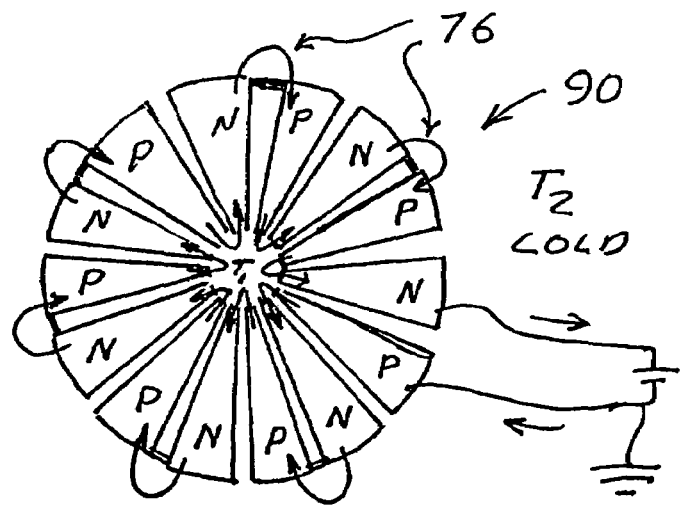

FIGS. 10A and 10B show another technique for utilizing thin films of quantum well layers as p-legs and n-legs in a module without stacking the legs as shown in FIGS. 4A, 4B and 4C. In this case current flow is radial through the n-legs N and the p-legs P 90 as shown in FIGS. 10A and 10B. Phase change material 74 in container 70 provides a constant temperature while fins 78 alternate in temperature above and below the phase change temperature. The arrows 76 in FIG. 10B show the direction of current flow when the fin temperature, $T_2$ is colder than the phase change temperature $T1$.

Electric Power from Cycling Temperature

Figure 6A:
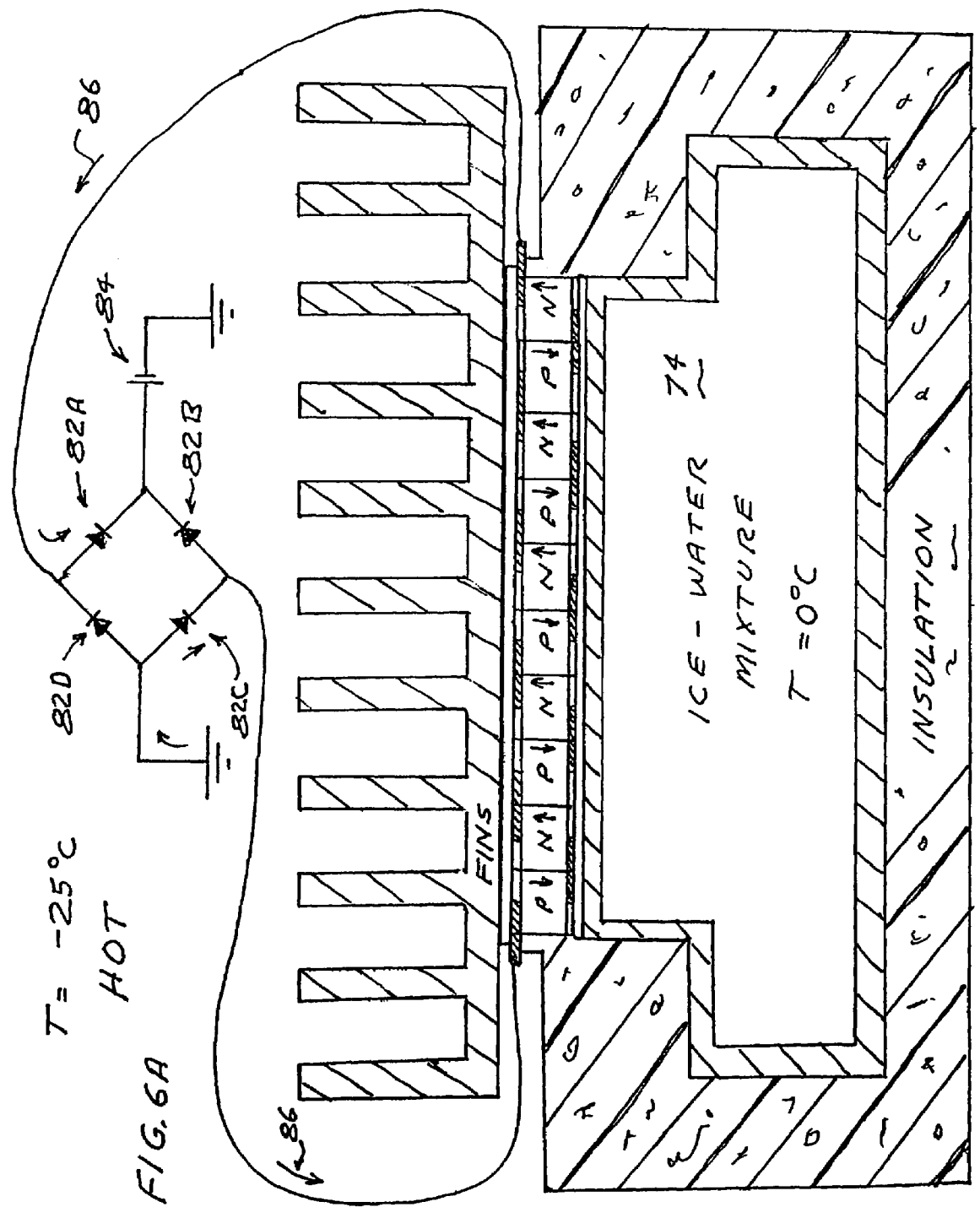

FIGS. 6A and 6B show the basic features of preferred embodiments of the present invention. In this example, based on a Mars application, we are assuming that the temperature of an environment varies between about minus 25 degrees centigrade as shown at 68A in FIG. 6A to about minus 85 degrees centigrade as shown in FIG. 6B from mid-day to mid-night during a period of about 12 hours. A container 70 insulated with thermal insulation 72 contains an ice-water mixture 74. A thermoelectric module 76 comprising n-legs N and p-legs P is sandwiched between a portion of a surface of container 70 and finned element 78. Electrically insulating film 80 separates the module from container 70 and finned element 78. Diode bridge structure comprising diodes 82A, B, C and D permit the charging of capacitor 84 both during periods of cold environmental condition and during periods of hot environmental condition. The temperature of ice-water mixture 74 remains at about minus 55 degrees centigrade at all times while the fin temperature changes with the environmental temperature swinging from minus 30 degrees to plus 30 degrees. The resulting temperature differences across the module cause electric potential differences across the p-legs and the n-legs of module 76. These potential differences produce current flow from hot to cold in the p-legs and from cold to hot in the n-legs. The direction of current flow is shown by arrows 86 in FIGS. 6A and 6B. Current flow through module 76 in the FIG. 6B example is opposite is opposite the current flow through module 76 in the FIG. 6A example; however, in both cases capacitor 84 is charged with electrical energy produced by the module as shown by the current flow arrows 86.

Energy from Temperature Cycles

Another embodiment of the present invention is an energy-harvesting device that produces electrical power without fuel or sunlight. The device uses daily temperature variations of the Martian atmosphere to convert heat into electrical power using thermoelectric technology. The device is innovative because it does not require fuel or sunlight for operation. Unlike solar cells, the energy-harvesting device will not be vulnerable to Martian dust storms and high impact landings. Replacing nuclear generators with the energy-harvesting generator will reduce mission costs and increase safety of human missions because of the absence of nuclear fuel.

Figure 9:
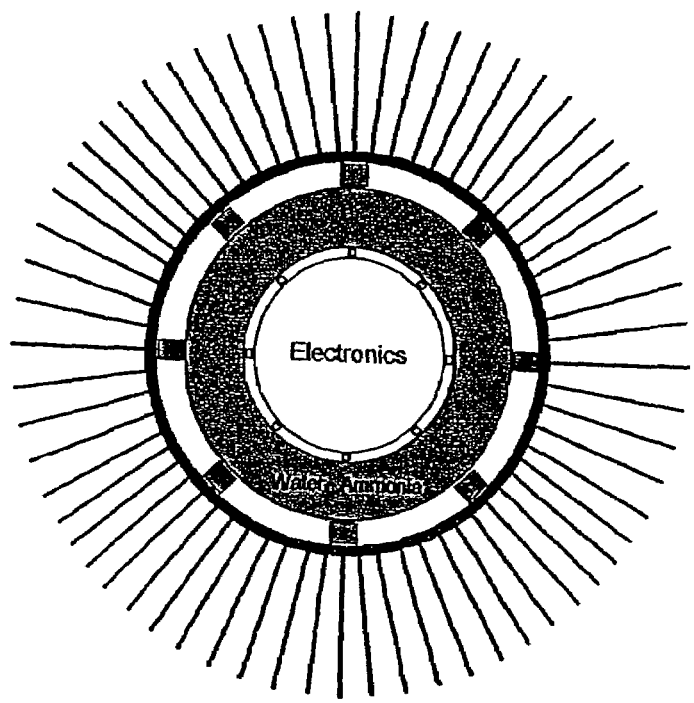
FIG. 9 shows a preferred embodiment of the present invention.
Figure 8:
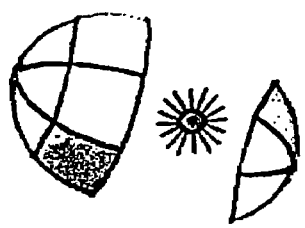
FIG. 8 shows a preferred technique of landing a preferred embodiment on Mars.

As shown in FIG. 9 this embodiment of the present invention utilizes a sphere for the basic shape of the generator because a sphere has the lowest surface area to volume ratio, thus it has minimal heat loss to volume ratio. A 1-foot diameter sphere for the generator is a reasonable dimension with a total weight of 3 pounds. The 3-pound estimate is the sum of 2.2 pounds of water-Ammonia solution (required for day and night melting and freezing on Mars) and the remaining 0.8 pounds is required for fins, spherical shell, modules, and electronics. A good candidate for the structure and fin material is graphite fiber because it is light and strong with a high thermal conductivity. Because the voltage polarity of the module is dependent on the direction of heat flow through the module, a custom circuit such as the one shown in FIGS. 6A and 6B is needed to maintain a constant voltage polarity with minimal reduction in electrical power. Such a diode rectifier bridge made of silicon diodes can be used to maintain this constant polarity similar to the one shown in FIGS. 6A and 6B. It is estimated that the energy-harvesting device will weigh 3 (lbs) and supply an average power of 30 mW at 3 Volts for most of the Martian year. Thousands of energy-harvesting devices could be deployed on the surface of Mars to collect weather and biologically related data for several decades. The device utilizes eighteen thermoelectric modules as shown at 90 in FIG. 8. These are small modules with dimensions of 0.3 inch×0.3 inch×0.1 inch. Each module consists of two sets of couples connected in parallel. Each set of couples consists of 169 couples connected in series. So the total number of couples in each module is 338. The couples are connected at both of the module surfaces with gold tabs that are spot-welded. At a temperature difference between the module surfaces and a matched load, the voltage produced by each of the modules is about 10 volts. The minimum useful voltage is about 1 volt that would be produced by a temperature difference of 2 degrees C. Twice per day, when the temperature difference is transitioning between plus 2 degrees and minus 2 degrees, the diodes will leak a small amount of current. Thus, in some embodiments a switch may be provided to isolate the capacitor during these low temperature-difference periods. The reader should note that additional modules could be added which would permit the unit to squeeze useful power out of these very small temperature differences. For example, if we use 36 modules instead of 18 and increase the length of the modules to 0.2 inch, we can obtain useful power at temperature differences down to 1 degree C. and increase the operating time of the unit from about 79 percent of each cycle to about 89.5 percent.

The energy-harvesting generator temperature is maintained at the daily average atmospheric temperature on Mars that is dependent on its location on Mars. The generator absorbs heat from the warm atmosphere during the day and expels heat to the atmosphere at night. This heat passes through a thermoelectric module and a fraction of the heat is converted into electrical power. The minimal wind speed of about 2.5 m/s throughout the Mars year provides the means of absorption and expulsion of heat to and from the generator's heat exchanger fins.

Figure 7:
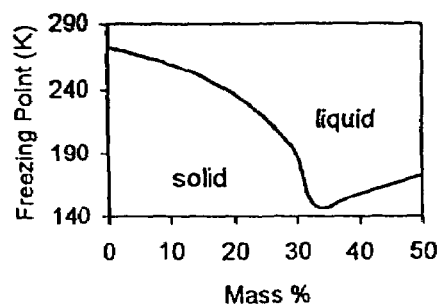
FIG. 7 show properties of a preferred phase change material.

A phase change substance such as a water-ammonia solution would work well on Mars because it has a high heat of fusion and wide variability in freezing temperature as indicated in FIG. 7. By choosing the appropriate ammonia to water mass fraction, the melting point of the solution could be adjusted to match the average daily temperature on Mars. This temperature would depend on the latitude (and somewhat on longitude) of the generator on Mars.

During the Mars night the water-ammonia solution freezes and during the Mars day it melts. The energy-harvesting generator has only enough solution so that a full night of generator cooling is required to freeze all of the solution and a full day of generator heating is needed to melt all of the solution. More solution than this would result in the addition of unnecessary generator weight. Less solution would result in the generator prematurely changing temperature before the day and nights end, which would result in a rapid reduction in temperature difference across the generator, thus less output power.

Module efficiency is more important than module power in the design of this generator because the weight of the heat storage solution (water-ammonia) must be reasonably low to reduce launch cost. (For application on earth, this is probably not a consideration. Thus, high module efficiency results in less heat storage solution required for a given amount of electrical energy. For a given fin design and fixed small temperature difference, the maximum module power output can be achieved if the module thermal resistance is equivalent to the thermal resistance of the fin unit. This is the optimal solution from the heat-flow-times-efficiency product for the module. This results in an equal temperature difference across the module and heat exchanger. However because generator mass is a concern for the Mars application, the unit may preferably be designed for a greater delta T across the module to increase the module efficiency at the cost of reduced electrical power. The highest module efficiency can be achieved if the delta T across the fins is nearly zero. However, this would require that the heat exchanger be very large. Thus volume becomes a problem.

Power Estimate

Applicants estimate that the energy-harvesting generator will produce 30 mW of power at 3 volts for 65% of the Martian year. This estimate is based on the following properties and conditions listed in Table 3 below.

TABLE 3

| Material Property or Condition | Value | Source |
| --- | --- | --- |
| Generator location on Mars (°N, °W) | 22, 48 | Tillman, 1994 |
| mean diurnal temperature (°K) | 210 | Tillman, 1994 |
| diurnal temperature variation (°K) | 40 | Tillman, 1994 |
| wind speed (m/s) | 2.5 | Tillman, 1994 |
| Atmospheric density (kg · m$^{-3}$) | 0.019 | Tillman, 1994 |
| Atmospheric kinematic viscosity (m$^2$ · s$^{-1}$) | 0.01 | Tillman, 1994 |
| Atmospheric pressure (mbar) | 7.2 | Seiff, 1976 |
| Thermal conductivity of $CO_2$ (mW · m$^{-1}$ · K$^{-1}$) | 9.6 | HC&P, 2001 |
| heat exchanger cross flow area (m$^2$) | 0.22 | selected for design |
| heat exchanger efficiency (%) | 75 | estimated |
| thermoelectric module efficiency range (%) | 0-0.78 | Marlow Ind., Inc. |
| water-ammonia freezing point (°K) | 210 | Perry, 1950 |
| water-ammonia heat of fusion (KJ · kg$^{-1}$) | 333 | HC&P, 2001 |

For 35% of the year the generator will provide only a couple milliwatts of electrical power. The generator will automatically shut down during this period, hence the generator would probably be best suited for low-cost, long-term missions in which continuous operation is not required and low temperature electronics are available. There may be other designs or materials that can limit this non-operational period.

The energy-harvesting generator could be deployed to various locations on the surface of Mars using an airbag landing system. Such a system was successfully demonstrated in NASA's deployment of the 2,000-pound lander during the Mars Pathfinder mission in 1976. The airbags used were 71 inches in diameter and made of high strength fiber called Vectran as indicated in FIG. 4. One air-bag encapsulating the 3 pounds harvesting generator (see FIG. 8) should provide more than enough impact protection. The generator would have about 2½ feet of cussion or flex distance on all sides of the airbag. The small size and weight of the proposed energy-harvesting generator would make large scale climate monitoring networks on Mars low-cost, safe, and long-term.

Other Applications Where Energy is Harvested from the Environment

In addition to space applications the present invention has many potential applications on earth. For example, it can be used for harvesting environmental energy for weather stations in remote locations for measuring environmental data such as wind speed, temperature, pressure, humidity and chemicals in the air and for transmitting the data environmental data. The unit could be deployed by aircraft in rugged or hazardous terrain and the unit could transmit the environmental data via satellites. The unit could operate for decades and could be abandoned after its useful life without concern of environmental pollution associated with batteries or radioactive heat sources.

Additional Description

Additional description of embodiments of the present invention is included in a Dec. 22, 3003 report and a Dec. 3, 2004 presentation, both are attached as Attachments A and B respectively.

While the above description contains many specificites, the reader should not construe these as limitations on the scope of the invention, but merely as exemplifications of preferred embodiments thereof. Those skilled in the art will envision many other possible variations within its scope. The thin layers of boron carbide and Si/SiC could be arranged in many other forms for various applications. In the preferred embodiment each leg is comprised of about 600 alternating layers; however, each leg could have substantially more or less layers. However, modules with less than 100 layers would suffer from poor efficiency due to heat losses through the substrate. It is not necessary that the layers be grown on film. For example, they could be grown on thicker substrates that are later removed. There are many other ways to make the connections between the legs other than the methods discussed. Accordingly, the reader is requested to determine the scope of the invention by the appended claims and their legal equivalents, and not by the examples which have been given.

We claim:

1. A thermoelectric module comprised of:
   A) a plurality of n-legs comprised of at least 100 very thin alternating layers; and
   B) a plurality of p-legs,
wherein said p-legs and said n-legs are electrically connected to produce said thermoelectric module; and
wherein said plurality of n-legs and p-legs are positioned radially between a heat source and a heat sink.

2. The thermoelectric module as in claim 1 wherein said p-legs comprise at least 100 very thin alternating layers of two types of boron carbide.

3. The thermoelectric module as in claim 1 wherein said n-leg is comprised of alternating layers of silicon and silicon-germanium.

4. The thermoelectric module as in claim 2 wherein said n-leg is comprised of alternating layers of silicon and silicon-germanium.

5. The thermoelectric module as in claim 1 wherein said n-leg is comprised of at least 600 alternating layers of silicon and silicon-germanium and said p-leg is comprised of at least 600 layers of two types of boron carbide.

6. The thermoelectric module as in claim 5 wherein said two types of boron carbide are $B_4C$ and $B_9C$.

\* \* \* \* \*